United States Patent
Tischler et al.

(10) Patent No.: US 9,054,290 B2
(45) Date of Patent: *__Jun. 9, 2015__

(54) ELECTRONIC DEVICES WITH YIELDING SUBSTRATES

(71) Applicants: Michael A. Tischler, Vancouver (CA); Philippe M. Schick, Vancouver (CA); Ian Ashdown, West Vancouver (CA); Calvin Wade Sheen, Chula Vista, CA (US); Paul Jungwirth, Burnaby (CA)

(72) Inventors: Michael A. Tischler, Vancouver (CA); Philippe M. Schick, Vancouver (CA); Ian Ashdown, West Vancouver (CA); Calvin Wade Sheen, Chula Vista, CA (US); Paul Jungwirth, Burnaby (CA)

(73) Assignee: Cooledge Lighting Inc., Richmond (CA)

( * ) Notice: Subject to any disclaimer, the term of this patent is extended or adjusted under 35 U.S.C. 154(b) by 0 days.

This patent is subject to a terminal disclaimer.

(21) Appl. No.: 14/456,573

(22) Filed: Aug. 11, 2014

(65) Prior Publication Data

US 2015/0001465 A1    Jan. 1, 2015

Related U.S. Application Data

(63) Continuation of application No. 14/169,384, filed on Jan. 31, 2014, now Pat. No. 8,907,370, which is a continuation of application No. 14/014,998, filed on Aug. 30, 2013, now Pat. No. 8,680,567, which is a (Continued)

(51) Int. Cl.
*H01L 33/00* (2010.01)
*H01L 21/00* (2006.01)

(Continued)

(52) U.S. Cl.
CPC ............. *H01L 33/62* (2013.01); *H01L 23/367* (2013.01); *H01L 23/4985* (2013.01); *H01L 24/32* (2013.01); *H01L 33/486* (2013.01); *H01L 2224/73204* (2013.01); *H01L 2924/01013* (2013.01); *H01L 2924/01029* (2013.01); *H01L 2924/0103* (2013.01); *H01L 2924/01047* (2013.01); *H01L 2924/01049* (2013.01); *H01L 2924/0105* (2013.01); *H01L 2924/01058* (2013.01); *H01L 2924/01073* (2013.01);

(Continued)

(58) Field of Classification Search
USPC .................................. 438/22–26; 257/81, 99
See application file for complete search history.

(56) References Cited

U.S. PATENT DOCUMENTS

| 4,675,575 A | 6/1987 | Smith et al. |
| 5,081,520 A | 1/1992 | Yoshii et al. |

(Continued)

FOREIGN PATENT DOCUMENTS

| CN | 102959708 A | 3/2013 |
| EP | 0265077 | 4/1988 |

(Continued)

OTHER PUBLICATIONS

International Search Report and Written Opinion mailed Jun. 2, 2011 for International Application No. PCT/CA2011/050006 (7 pages).

(Continued)

*Primary Examiner* — Calvin Lee
(74) *Attorney, Agent, or Firm* — Morgan, Lewis & Bockius LLP

(57) ABSTRACT

In accordance with certain embodiments, a semiconductor die is adhered directly to a yielding substrate with a pressure-activated adhesive notwithstanding any nonplanarity of the surface of the semiconductor die or non-coplanarity of the semiconductor die contacts.

55 Claims, 25 Drawing Sheets

Related U.S. Application Data continuation of application No. 13/751,563, filed on Jan. 28, 2013, now Pat. No. 8,552,463, which is a continuation of application No. 13/171,973, filed on Jun. 29, 2011, now Pat. No. 8,384,121.

(60) Provisional application No. 61/359,467, filed on Jun. 29, 2010, provisional application No. 61/363,179, filed on Jul. 9, 2010, provisional application No. 61/376,707, filed on Aug. 25, 2010, provisional application No. 61/390,128, filed on Oct. 5, 2010, provisional application No. 61/393,027, filed on Oct. 14, 2010, provisional application No. 61/433,249, filed on Jan. 16, 2011, provisional application No. 61/445,416, filed on Feb. 22, 2011, provisional application No. 61/447,680, filed on Feb. 28, 2011.

(51) Int. Cl.

| | | |
|---|---|---|
| *H01L 33/62* | (2010.01) | |
| *H05K 3/32* | (2006.01) | |
| *H01L 33/60* | (2010.01) | |
| *H01L 33/08* | (2010.01) | |
| *H01L 33/32* | (2010.01) | |
| *H01L 33/50* | (2010.01) | |
| *H01L 33/58* | (2010.01) | |
| *H01L 27/15* | (2006.01) | |
| H01L 23/367 | (2006.01) | |
| H01L 23/498 | (2006.01) | |
| H01L 23/00 | (2006.01) | |
| H01L 33/48 | (2010.01) | |
| H05K 1/18 | (2006.01) | |
| G02F 1/1335 | (2006.01) | |

(52) U.S. Cl.
CPC ........... H01L 2924/01079 (2013.01); H01L 2924/01082 (2013.01); H05K 1/189 (2013.01); H05K 3/323 (2013.01); H05K 2201/09036 (2013.01); H05K 2201/10106 (2013.01); H05K 2203/302 (2013.01); G02F 1/133603 (2013.01); H01L 2924/01005 (2013.01); H01L 2924/01006 (2013.01); H01L 2924/01019 (2013.01); H01L 2924/0102 (2013.01); H01L 2924/01023 (2013.01); H01L 2924/01024 (2013.01); H01L 2924/01033 (2013.01); H01L 2924/01063 (2013.01); H01L 2924/01074 (2013.01); H01L 2924/01075 (2013.01); H01L 2924/01078 (2013.01); H01L 2924/014 (2013.01); H01L 2924/10329 (2013.01); H01L 2924/0132 (2013.01); H01L 2224/32225 (2013.01); H01L 33/60 (2013.01); H01L 24/83 (2013.01); H01L 2224/83851 (2013.01); H01L 2224/2929 (2013.01); H01L 33/08 (2013.01); H01L 33/32 (2013.01); H01L 33/502 (2013.01); H01L 33/58 (2013.01); H01L 2924/07811 (2013.01); H01L 2224/06102 (2013.01); H01L 2924/07802 (2013.01); H01L 2924/12041 (2013.01); H01L 27/156 (2013.01); H01L 33/0025 (2013.01)

(56) References Cited

U.S. PATENT DOCUMENTS

| | | | |
|---|---|---|---|
| 5,631,191 | A | 5/1997 | Durand et al. |
| 5,918,113 | A | 6/1999 | Higashi et al. |
| 6,281,450 | B1 | 8/2001 | Urasaki et al. |
| 6,306,686 | B1 | 10/2001 | Horton et al. |
| 6,357,889 | B1 | 3/2002 | Duggal et al. |
| 6,357,893 | B1 | 3/2002 | Belliveau |
| 6,478,909 | B1 | 11/2002 | Tuttle |
| 6,501,102 | B2 | 12/2002 | Mueller-mach et al. |
| 6,513,949 | B1 | 2/2003 | Marshall et al. |
| 6,518,097 | B1 | 2/2003 | Yim et al. |
| 6,576,488 | B2 | 6/2003 | Collins, III et al. |
| 6,603,258 | B1 | 8/2003 | Mueller-mach et al. |
| 6,614,103 | B1 | 9/2003 | Durocher et al. |
| 6,621,211 | B1 | 9/2003 | Srivastava et al. |
| 6,642,652 | B2 | 11/2003 | Collins, III et al. |
| 6,650,044 | B1 | 11/2003 | Lowery |
| 6,665,170 | B1 | 12/2003 | Warner et al. |
| 6,685,852 | B2 | 2/2004 | Setlur et al. |
| 6,689,999 | B2 | 2/2004 | Haines et al. |
| 6,733,711 | B2 | 5/2004 | Durocher et al. |
| 6,764,878 | B2 | 7/2004 | Fujisawa et al. |
| 6,936,857 | B2 | 8/2005 | Doxsee et al. |
| 6,939,481 | B2 | 9/2005 | Srivastava et al. |
| 6,965,361 | B1 | 11/2005 | Sheats et al. |
| 6,998,777 | B2 | 2/2006 | Suehiro et al. |
| 7,005,679 | B2 | 2/2006 | Tarsa et al. |
| 7,025,651 | B2 | 4/2006 | Song et al. |
| 7,042,165 | B2 | 5/2006 | Madhani et al. |
| 7,052,924 | B2 | 5/2006 | Daniels et al. |
| 7,115,983 | B2 | 10/2006 | Wagner |
| 7,122,405 | B2 | 10/2006 | Tiao |
| 7,163,327 | B2 | 1/2007 | Henson et al. |
| 7,206,507 | B2 | 4/2007 | Lee et al. |
| 7,207,693 | B2 | 4/2007 | Ratcliffe |
| 7,217,956 | B2 | 5/2007 | Daniels et al. |
| 7,244,326 | B2 | 7/2007 | Craig et al. |
| 7,256,483 | B2 | 8/2007 | Epler et al. |
| 7,259,030 | B2 | 8/2007 | Daniels et al. |
| 7,294,861 | B2 | 11/2007 | Schardt et al. |
| 7,294,961 | B2 | 11/2007 | Daniels et al. |
| 7,316,488 | B2 | 1/2008 | Wall, Jr. |
| 7,319,246 | B2 | 1/2008 | Soules et al. |
| 7,335,951 | B2 | 2/2008 | Nishi et al. |
| 7,344,902 | B2 | 3/2008 | Basin et al. |
| 7,344,952 | B2 | 3/2008 | Chandra |
| 7,427,782 | B2 | 9/2008 | Daniels et al. |
| 7,482,760 | B2 | 1/2009 | Jungwirth et al. |
| 7,488,088 | B2 | 2/2009 | Brukilacchio |
| 7,488,621 | B2 | 2/2009 | Epler et al. |
| 7,498,734 | B2 | 3/2009 | Suehiro et al. |
| 7,564,070 | B2 | 7/2009 | Sayers et al. |
| 7,618,157 | B1 | 11/2009 | Galvez et al. |
| 7,638,854 | B2 | 12/2009 | Tanaka et al. |
| 7,642,708 | B2 | 1/2010 | Juestel et al. |
| 7,656,371 | B2 | 2/2010 | Shimizu et al. |
| 7,663,234 | B2 | 2/2010 | Sun et al. |
| 7,682,850 | B2 | 3/2010 | Harbers et al. |
| 7,703,942 | B2 | 4/2010 | Narendran et al. |
| 7,723,733 | B2 | 5/2010 | Daniels et al. |
| 7,740,373 | B2 | 6/2010 | Yoon et al. |
| 7,758,221 | B2 | 7/2010 | Weijers |
| 7,766,536 | B2 | 8/2010 | Peifer et al. |
| 7,775,685 | B2 | 8/2010 | Loh |
| 7,791,093 | B2 | 9/2010 | Basin et al. |
| 7,811,843 | B1 | 10/2010 | Lai |
| 7,819,539 | B2 | 10/2010 | Kim et al. |
| 7,821,023 | B2 | 10/2010 | Yuan et al. |
| 7,828,459 | B2 | 11/2010 | Rains |
| 7,833,837 | B2 | 11/2010 | Yang et al. |
| 7,838,346 | B2 | 11/2010 | Tokunaga |
| 7,847,302 | B2 | 12/2010 | Basin et al. |
| 7,855,092 | B2 | 12/2010 | Shimizu et al. |
| 7,858,198 | B2 | 12/2010 | Kashiwagi et al. |
| 7,858,408 | B2 | 12/2010 | Mueller et al. |
| 1,000,214 | A1 | 1/2011 | Tsukahara et al. |
| 7,863,760 | B2 | 1/2011 | Daniels et al. |
| 7,897,483 | B2 | 3/2011 | Yamazaki et al. |
| 7,898,085 | B2 | 3/2011 | Fujimori |
| 7,902,550 | B2 | 3/2011 | Yamazaki |
| 7,902,560 | B2 | 3/2011 | Bierhuizen et al. |
| 7,909,480 | B2 | 3/2011 | Kang et al. |
| 7,909,496 | B2 | 3/2011 | Matheson et al. |
| 7,932,531 | B2 | 4/2011 | Lin et al. |
| 1,011,498 | A1 | 5/2011 | Suehiro et al. |
| 7,948,468 | B2 | 5/2011 | Zane et al. |

(56) References Cited

U.S. PATENT DOCUMENTS

| | | | |
|---|---|---|---|
| 1,016,368 A1 | 7/2011 | Dau et al. |
| 7,972,031 B2 | 7/2011 | Ray et al. |
| 7,997,784 B2 | 8/2011 | Tsai |
| 8,119,427 B1 | 2/2012 | Lu |
| 8,338,849 B2 | 12/2012 | Tischler et al. |
| 8,384,114 B2 | 2/2013 | Tischler et al. |
| 8,384,121 B2* | 2/2013 | Tischler et al. | 257/99 |
| 8,466,488 B2 | 6/2013 | Tischler et al. |
| 8,493,000 B2 | 7/2013 | Jungwirth |
| 8,552,463 B2* | 10/2013 | Tischler et al. | 257/99 |
| 8,653,539 B2 | 2/2014 | Tischler et al. |
| 8,680,567 B2* | 3/2014 | Tischler et al. | 257/99 |
| 8,704,448 B2 | 4/2014 | Tischler et al. |
| 8,860,318 B2 | 10/2014 | Tischler et al. |
| 8,877,561 B2 | 11/2014 | Tischler |
| 8,907,370 B2 | 12/2014 | Tischler et al. |
| 8,921,134 B2 | 12/2014 | Tischler et al. |
| 2002/0179816 A1 | 12/2002 | Haines et al. |
| 2003/0019735 A1 | 1/2003 | Howie et al. |
| 2003/0102570 A1 | 6/2003 | Imasu et al. |
| 2005/0056948 A1 | 3/2005 | Uchiyama |
| 2005/0073840 A1 | 4/2005 | Chou et al. |
| 2005/0110161 A1 | 5/2005 | Naito et al. |
| 2005/0183884 A1 | 8/2005 | Su |
| 2005/0214963 A1 | 9/2005 | Daniels et al. |
| 2005/0230853 A1 | 10/2005 | Yoshikawa |
| 2006/0001055 A1 | 1/2006 | Ueno et al. |
| 2006/0186423 A1 | 8/2006 | Blonder et al. |
| 2006/0228973 A1 | 10/2006 | Janning |
| 2007/0069663 A1 | 3/2007 | Burdalski et al. |
| 2007/0096113 A1 | 5/2007 | Inoshita et al. |
| 2007/0096272 A1 | 5/2007 | Wang |
| 2007/0145884 A1 | 6/2007 | Wu et al. |
| 2007/0211449 A1 | 9/2007 | Holman et al. |
| 2007/0223219 A1 | 9/2007 | Medendorp et al. |
| 2007/0252512 A1 | 11/2007 | Bertram et al. |
| 2007/0262920 A1 | 11/2007 | Werner et al. |
| 2007/0297020 A1 | 12/2007 | Shen et al. |
| 2008/0007885 A1 | 1/2008 | Mehrl et al. |
| 2008/0019134 A1 | 1/2008 | Mukai |
| 2008/0101070 A1 | 5/2008 | Chou |
| 2008/0157689 A1 | 7/2008 | Kato |
| 2008/0179602 A1 | 7/2008 | Negley et al. |
| 2008/0179611 A1 | 7/2008 | Chitnis et al. |
| 2008/0186704 A1 | 8/2008 | Chou et al. |
| 2008/0239724 A1 | 10/2008 | Moriyama et al. |
| 2008/0315228 A1 | 12/2008 | Krames et al. |
| 2009/0002810 A1 | 1/2009 | Jeon et al. |
| 2009/0026915 A1 | 1/2009 | Nagatomi et al. |
| 2009/0073350 A1 | 3/2009 | Toyama et al. |
| 2009/0095966 A1 | 4/2009 | Keller et al. |
| 2009/0096370 A1 | 4/2009 | Murazaki et al. |
| 2009/0108474 A1 | 4/2009 | Mizutani |
| 2009/0109668 A1 | 4/2009 | Isobe |
| 2009/0114932 A1 | 5/2009 | Chou |
| 2009/0160364 A1 | 6/2009 | Ackermann et al. |
| 2009/0166064 A1 | 7/2009 | Nishikawa et al. |
| 2009/0178834 A1 | 7/2009 | Akutsu et al. |
| 2009/0212257 A1 | 8/2009 | Sohn et al. |
| 2009/0239086 A1 | 9/2009 | Ishizuka et al. |
| 2009/0243457 A1 | 10/2009 | Jung et al. |
| 2009/0244882 A1 | 10/2009 | Samber et al. |
| 2009/0256163 A1 | 10/2009 | Chakraborty |
| 2010/0001631 A1 | 1/2010 | Gotoh et al. |
| 2010/0051984 A1 | 3/2010 | West |
| 2010/0060144 A1 | 3/2010 | Justel et al. |
| 2010/0075459 A1 | 3/2010 | Kerr et al. |
| 2010/0085727 A1 | 4/2010 | Igarashi et al. |
| 2010/0096977 A1 | 4/2010 | Lee et al. |
| 2010/0207536 A1 | 8/2010 | Burdalski et al. |
| 2010/0214777 A1 | 8/2010 | Suehiro et al. |
| 2010/0244071 A1 | 9/2010 | Wada et al. |
| 2010/0277084 A1 | 11/2010 | Lee et al. |
| 2010/0283072 A1 | 11/2010 | Kazlas et al. |
| 2010/0295070 A1 | 11/2010 | Su et al. |
| 2010/0295077 A1 | 11/2010 | Melman |
| 2010/0295078 A1 | 11/2010 | Chen et al. |
| 2010/0320928 A1 | 12/2010 | Kaihotsu et al. |
| 2011/0031516 A1 | 2/2011 | Basin et al. |
| 2011/0045619 A1 | 2/2011 | Ling |
| 2011/0058372 A1 | 3/2011 | Lerman et al. |
| 2011/0063838 A1 | 3/2011 | Dau et al. |
| 2011/0101399 A1 | 5/2011 | Suehiro et al. |
| 2011/0104834 A1 | 5/2011 | Suehiro et al. |
| 2011/0108878 A1 | 5/2011 | Namiki et al. |
| 2011/0180818 A1 | 7/2011 | Lerman et al. |
| 2011/0193105 A1 | 8/2011 | Lerman et al. |
| 2011/0193106 A1 | 8/2011 | Lerman et al. |
| 2011/0193114 A1 | 8/2011 | Lerman et al. |
| 2011/0195532 A1 | 8/2011 | Lerman et al. |
| 2011/0198631 A1 | 8/2011 | Lerman et al. |
| 2011/0198632 A1 | 8/2011 | Lerman et al. |
| 2011/0204390 A1 | 8/2011 | Lerman et al. |
| 2011/0204391 A1 | 8/2011 | Lerman et al. |
| 2011/0243176 A1 | 10/2011 | Mooney et al. |
| 2011/0303936 A1 | 12/2011 | Wu |
| 2011/0316422 A1 | 12/2011 | Tischler et al. |
| 2012/0146066 A1 | 6/2012 | Tischler et al. |
| 2012/0217496 A1 | 8/2012 | Tischler et al. |
| 2012/0248477 A1 | 10/2012 | Tischler et al. |
| 2012/0256290 A1 | 10/2012 | Renna et al. |
| 2013/0181619 A1 | 7/2013 | Tischler et al. |
| 2013/0301274 A1 | 11/2013 | Anderson |
| 2013/0328172 A1 | 12/2013 | Tischler |
| 2013/0330853 A1 | 12/2013 | Tischler |
| 2014/0034960 A1 | 2/2014 | Tischler et al. |
| 2014/0062302 A1 | 3/2014 | Tischler et al. |
| 2014/0062315 A1 | 3/2014 | Tischler et al. |
| 2014/0191257 A1 | 7/2014 | Tischler et al. |
| 2015/0042231 A1 | 2/2015 | Tischler et al. |

FOREIGN PATENT DOCUMENTS

| | | |
|---|---|---|
| EP | 1067598 | 1/2001 |
| EP | 1473978 | 11/2004 |
| EP | 1653523 | 5/2006 |
| EP | 1770788 | 4/2007 |
| EP | 2017890 | 1/2009 |
| EP | 2031437 A1 | 3/2009 |
| EP | 2589082 A1 | 5/2013 |
| EP | 2609791 A1 | 7/2013 |
| JP | 55-8061 A | 1/1980 |
| JP | 9-148374 A | 6/1997 |
| JP | 2011-251645 | 9/1999 |
| JP | 2001-007157 A | 1/2001 |
| JP | 2001-298042 A | 10/2001 |
| JP | 2002-76057 A | 3/2002 |
| JP | 2005-136399 A | 5/2005 |
| JP | 2007-123613 A | 5/2007 |
| JP | 2007-142173 | 6/2007 |
| JP | 2010-135513 A | 6/2010 |
| JP | 2013-531378 A | 8/2013 |
| JP | 2014-160835 A | 9/2014 |
| KR | 10-1372084 B1 | 3/2014 |
| TW | 423166 | 9/1999 |
| WO | WO-90/01751 | 2/1990 |
| WO | WO-99/60829 | 11/1999 |
| WO | WO-2005/062382 | 7/2005 |
| WO | 2005/119314 A2 | 12/2005 |
| WO | WO-2007/067758 | 6/2007 |
| WO | 2007/094167 A1 | 8/2007 |
| WO | WO-2007/105853 | 9/2007 |
| WO | WO-2008/051397 | 5/2008 |
| WO | WO-2009/079040 | 6/2009 |
| WO | WO-2010/098273 | 9/2010 |
| WO | 2012/000114 A1 | 1/2012 |

OTHER PUBLICATIONS

International Search Report and Written Opinion mailed Sep. 7, 2011 for International Application No. PCT/CA2011/050399 (11 pages).

Korean Office Action dated Oct. 29, 2013 for corresponding Korean Patent Application No. 10-2013-7002293, English translation of "Reason for Rejection".

(56) References Cited

OTHER PUBLICATIONS

Japanese Office Action dated Aug. 16, 2013 for corresponding Japanese Patent Application No. JP2013-516931, English translation of "Reason for Rejection".
Japanese Office Action dated Nov. 18, 2013 for corresponding Japanese Patent Application No. JP2013-516931, English translation of "Reason for Rejection".
Official Action for Japanese Patent Application No. 2014-063919 and English translation mailed Dec. 17, 2014 (7 pages).
Extended European Search Report received for European Patent Application No. 11800038, mailed on Jan. 26, 2015, 11 pages.
PCT International Patent Application No. PCT/CA2011/050436, International Search Report and Written Opinion mailed Oct. 24, 2011, 9 pages.
Extended European Search Report received for European Patent Application No. 11819246.7, mailed on Jul. 8, 2014, 6 pages.
PCT International Patent Application No. PCT/CA2011/050399, International Preliminary Report on Patentability mailed Jan. 17, 2013, 9 pages.
PCT International Patent Application No. PCT/CA2011/050436, International Preliminary Report on Patentability mailed Mar. 7, 2013, 7 pages.
PCT International Patent Application No. PCT/US2010/039684, International Preliminary Report on Patentability issued Jan. 4, 2012, 8 pages.
PCT International Patent Application No. PCT/US2010/039684, International Search Report and Written Opinion mailed Aug. 30, 2011, 9 pages.
Park et al., "Printed Assemblies of Inorganic Light-Emitting Diodes for Deformable and Semitransparent Displays", Science, vol. 325. No. 5943, Aug. 21, 2009, pp. 977-981.

* cited by examiner

ELECTRONIC DEVICES WITH YIELDING SUBSTRATES

RELATED APPLICATIONS

This application is a continuation of U.S. patent application Ser. No. 14/169,384, filed Jan. 31, 2014, now U.S. Pat. No. 8,907,370 issued Dec. 9, 2014, which is a continuation of U.S. patent application Ser. No. 14/014,998, filed Aug. 30, 2013, now U.S. Pat. No. 8,680,567 issued Mar. 25, 2014, which is a continuation of U.S. patent application Ser. No. 13/751,563, filed Jan. 28, 2013, now U.S. Pat. No. 8,552,463 issued Oct. 8, 2013, which is a continuation of U.S. patent application Ser. No. 13/171,973, filed Jun. 29, 2011, now U.S. Pat. No. 8,384,121 issued Feb. 26, 2013, which claims the benefit of and priority to U.S. Provisional Patent Application No. 61/359,467, filed Jun. 29, 2010, U.S. Provisional Patent Application No. 61/363,179, filed Jul. 9, 2010, U.S. Provisional Patent Application No. 61/376,707, filed Aug. 25, 2010, U.S. Provisional Patent Application No. 61/390,128, filed Oct. 5, 2010, U.S. Provisional Patent Application No. 61/393,027, filed Oct. 14, 2010, U.S. Provisional Patent Application No. 61/433,249, filed Jan. 16, 2011, U.S. Provisional Patent Application No. 61/445,416, filed Feb. 22, 2011, and U.S. Provisional Patent Application No. 61/447,680, filed Feb. 28, 2011. The entire disclosure of each of these applications is hereby incorporated herein by reference.

FIELD OF THE INVENTION

The present invention generally relates to electronic devices, and more specifically to array-based electronic devices.

BACKGROUND

Discrete light sources such as light-emitting diodes (LEDs) are an attractive alternative to incandescent light bulbs in illumination devices due to their higher efficiency, smaller form factor, longer lifetime, and enhanced mechanical robustness. However, the high cost of LEDs and associated heat-sinking and thermal-management systems have limited the widespread utilization of LEDs, particularly in general lighting applications.

The high cost of LED-based lighting systems has several contributors. LEDs are typically encased in a package and multiple packaged LEDs are used in each lighting system to achieve the required light intensity. In order to reduce costs, LED manufacturers have developed high-power LEDs, which can emit relatively higher light intensities by operating at relatively higher currents. While reducing the package count, these LEDs require relatively higher-cost packages to accommodate the higher current levels and to manage the significantly higher heat levels that result. The higher heat loads and currents, in turn, require more expensive thermal-management and heat-sinking systems—for example, thermal slugs in the package, ceramic or metal submounts, large metal or ceramic heat sinks, metal core printed circuit boards and the like—which also add to the cost as well as to size of the system. Higher operating temperatures also lead to shorter lifetimes as well as reduced reliability. Finally, LED efficacy typically decreases with increasing drive current, so operation of LEDs at relatively higher currents results in a relative reduction in efficacy as compared with lower-current operation. In order to support high-current operation, the LED chip (inside the package) requires relatively larger contact areas. In addition, high-power LEDs often have a current-blocking layer under the contacts to prevent light emission in those areas. The larger contact areas and current-blocking layer diminish the light-emitting area of the chip, resulting in reduced efficiency, fewer chips per wafer and increased cost.

Contact size is further limited by the method used to connect the LED chip to the package, another substrate or other supporting components. Most commonly, LED chips are interconnected using wire bonding. The wire-bonding process requires a certain minimum contact area, independent of current level. As a result, even in low-current LEDs, the contact size cannot be reduced below the minimum required for wire bonding. Another common approach for connection of the LED chip to the package is to use agents such as solder or conductive adhesives to bond a LED to a package, submount or substrate. These agents may also be relatively expensive and require complicated processes to control their dispersion so as to prevent the contacts of the LED from shorting together and rendering the device inoperative; this is particularly so as device geometries (for example, spacing between contacts) and dimensions continue to shrink.

One recent advance facilitating the connectivity of LEDs to a variety of substrates is anisotropically conductive adhesive (ACA), which enables electrical interconnection in one direction (e.g., vertically between a device contact and a substrate contact), but prevents it in other directions (e.g., horizontally between contacts on a device or between contracts on a substrate). State-of-the-art ACAs are pressure-activated, and thus require provision of "stud bumps" or other metallic projections on the surface to which the LED is to be bonded or on the LED bond pads in order to create the anisotropic electrical conductivity and promote adhesion. While other, non-pressure-activated types of ACA exist (e.g., ZTACH available from SunRay Scientific of Mt. Laurel, N.J., for which a magnetic field rather than pressure is applied during curing in order to align magnetic and conductive "columns" in the desired conduction direction), such ACAs are less common and require additional, and potentially expensive, equipment (e.g., magnets).

As known in the art, a pressure-activated ACA typically comprises an adhesive base. e.g., an adhesive or epoxy material, containing "particles" (e.g., spheres) of a conductive material or of an insulating material coated with a conductive material (such as metal or a conductive material coated with an insulating material. FIG. 1 depicts a conventional use of pressure-activated ACA to connect an electronic device to a substrate. As shown, the electronic device 100 having multiple contacts 110 has been adhered and electrically connected to a substrate 120 via use of an ACA 130. The ACA 130 comprises an adhesive base 140 containing a dispersion of particles 150 that are at least partially conductive. As mentioned above and as shown in FIG. 1, conventionally, the use of ACA requires the target substrate to contain stud bumps (which typically have a thickness of at least 30 μm-50 μm), or other conductive structures projecting from the substrate, opposite the device contacts to be bonded in order to achieve adequate bonding and electrical connectivity between the device and the electrical interconnects on the substrate. That is, in the context of FIG. 1, the adhesion and electrical connection of contacts 110 to electrical traces 160 (the thickness of which has been exaggerated for clarity) on substrate 120 requires the presence of stud bumps 170. As shown, the conductive particles 150 provide electrical connectivity between each contact 110 and its respective trace 160, but are dispersed within base 140 at a sufficiently low density such that an electrical connection is not formed between the contacts 110 and/or the traces 160. The stud bumps 170 provide not only a portion of the electrical connection, but also a solid platform against which the particles 150 are compressed, sharply increasing the conductivity of the ACA 130 and enabling the electrical connection therethrough (but not across the uncompressed ACA between the contact/stud bump pairs). In an alternate geometry, the stud bumps may be attached to contacts 110. It should be noted that other techniques involving ACAs are possible, and the present invention is not limited by the particular mode of operation of the ACA.

However, the use of stud bumps or equivalent conductive structures may be problematic and costly in many applications. Particularly as device and device-contact dimensions continue to decrease, stud bumps are frequently too large for connection to individual contacts. Formation of stud bumps also necessarily entails the formation of topography on the substrate, a complicated and expensive process, particularly when device contacts are non-coplanar (as stud bumps of a variety of heights are required). Furthermore, in applications utilizing unpackaged semiconductor die (e.g., bare-die LEDs), bonding of the device to stud bumps may result in deleterious localized stress (e.g., if the die bows between stud bumps due to the applied bonding pressure). Finally, use of stud bumps or similar structures may result in thermal-expansion mismatch (and concomitant stress) between the bumps and the substrate or bonded die.

However, without stud bumps or other projecting structures, bonding a semiconductor die to conventional substrates will not result in a reliable electrical connection therebetween, particularly if the contacts on the semiconductor die are non-coplanar. FIG. 2 depicts a common device environment that illustrates the problem. As shown, a LED die 200 features a contact 210 to an n-doped layer 220 and a contact 230 to a p-doped layer 240. A portion of the p-doped layer 240 has been removed to enable formation of contact 210 over the n-doped layer 220, rendering contacts 210 and 230 non-coplanar. In FIG. 2, an attempt has been made to bond LED die 200 to a conventional substrate 120 (e.g., a printed circuit board), which is substantially rigid and non-deformable. Due at least in part to the non-coplanarity between contact 210 and contact 230, the particles 150 of the pressure-activated ACA 130 establish electrical contact in the compression zone between contact 230 and its corresponding trace 160-1, but, in the absence of stud bumps, a similar electrical connection cannot be formed between contact 210 and its corresponding trace 160-2 due to the absence of sufficient compression. Even if a temporary electrical connection is initially formed between contact 210 and trace 160-2, upon cure of the ACA 130 and/or during operation, the ACA 130 may expand or contract, resulting in the loss of electrical contact and inoperability of LED die 200. Such expansion and/or contraction may also occur during operation, for example from ambient heating or self-heating from operation, resulting in unreliable operation.

In view of the foregoing, a need exists for systems and procedures enabling the low cost reliable bonding of various semiconductor dies (e.g., LED dies and solar cell dies) directly to a substrate's electrical traces via pressure-activated adhesives without the use of stud bumps or similar structures and low cost, reliable LED-based lighting systems based on such systems and processes.

SUMMARY

In accordance with certain embodiments, one or more semiconductor dies are attached to a flexible and/or deformable substrate with a pressure-sensitive adhesive (e.g., an ACA) without the use of intervening stud bumps or similar structures. The substrate is able to locally yield to compression force and form a mechanically strong and electrically conductive connection to the semiconductor-die contacts, notwithstanding any non-coplanarity of the contacts. In some embodiments, the substrate is "flexible" in the sense of being pliant in response to a force and resilient, i.e., tending to elastically resume an original configuration upon removal of the force. A substrate may be "deformable" in the sense of conformally yielding to a force, but the deformation may or may not be permanent; that is, the substrate may not be resilient. Flexible materials used herein may or may not be deformable (i.e., they may elastically respond by, for example, bending without undergoing structural distortion), and deformable substrates may or may not be flexible (i.e., they may undergo permanent structural distortion in response to a force). The term "yielding" is herein used to connote a material that is flexible or deformable or both.

The use of the yielding substrate simplifies the bonding and substrate-preparation procedures, and also facilitates deployment of the semiconductor dies in environments and/or applications unsuitable for rigid substrates. The substrate may even be substantially transparent, further broadening the scope of potential applications for which embodiments of the invention may be utilized. Since the yielding substrate enables the inexpensive and simple fabrication of assemblies featuring arrays of semiconductor dies, embodiments of the invention may even be advantageously utilized in applications where substrate rigidity may be preferred. For example, the flexible substrate(s) and semiconductor dies may be attached to and/or mounted within substantially rigid frames or other apparatus that provide structural support. In one such embodiment, one or more arrays of light-emitting semiconductor dies on one or more yielding substrates may be mounted within a rigid frame to form a lighting assembly for applications such as backlighting and general illumination.

An advantage of the present invention is the ability to replace today's fluorescent fixtures (e.g., standard linear fluorescent troffers), which can be inefficient due to optical losses, with designs that minimize optical loss. Moreover, fluorescent lamps contain mercury, which can be environmentally deleterious unless disposed of properly (and expensively). Embodiments of the present invention have luminous efficacies greater than those associated with conventional fluorescent fixtures. More generally, LED lighting has the potential to dramatically reduce energy consumption due to its much higher efficiency relative to incandescent, halogen and compact fluorescent lamps.

In an aspect, embodiments of the invention feature an electronic device comprising a semiconductor die having first and second distinct non-coplanar contacts on a first surface thereof, and a yielding substrate having first and second conductive traces on a first surface thereof. The first and second conductive traces are separated on the substrate by a gap therebetween. The first and second contacts are adhered to and in electrical contact with, respectively, the first and second conductive traces with a pressure-activated adhesive material notwithstanding the non-coplanarity of the first and second contacts, and without electrically bridging the traces or the contacts. In some embodiments, the substrate is flexible but not deformable; in other embodiments, the substrate is deformable but not flexible; while in still other embodiments, the substrate is both flexible and deformable.

The semiconductor die may comprise a LED die, e.g., an inorganic LED die. Alternatively, the semiconductor die may comprise a laser and may comprise a semiconductor material comprising or consisting essentially of at least one of GaN, AlN, InN, or an alloy or mixture thereof; or a semiconductor material comprising or consisting essentially of at least one of silicon, GaAs, InAs, AlAs, InP, GaP, AlP, InSb, GaSb, AlSb, ZnO, or an alloy or mixture thereof.

In various embodiments, the adhesive material comprises or consists essentially of an ACA electrically connecting the first contact only to the first trace and the second contact only to the second trace. A portion of the ACA may disposed in the gap to substantially isolate the first contact from the second contact. In some embodiments, the adhesive material comprises a substantially isotropic adhesive electrically connecting the first contact only to the first trace and the second contact only to the second trace, and the device further comprises a non-conductive adhesive material disposed in the gap. The first and second traces may have substantially uniform and substantially equal thicknesses.

In some embodiments, the device further comprises a reflective material over at least a portion of the first surface of the semiconductor die. An offset between the first and second contacts along a dimension substantially perpendicular to the first surface of the semiconductor die may be at least 0.25 µm. In various embodiments, the semiconductor die is unpackaged. The yielding substrate may comprise a localized deformation between the first and second traces, whereby the distance between the first contact and the substrate is substantially equal to the distance between the second contact and the substrate.

In general, the semiconductor die will extend across the gap between the first and second traces, and in some embodiments, a second semiconductor die, proximate the semiconductor die, also extends across the gap between the first and second traces. In some embodiments, the first and second conductive traces comprise a conductive ink; and the conductive ink may comprise, for example, silver, gold, aluminum, chromium, copper, and/or carbon. In various embodiments, the reflectivity of the substrate for a wavelength emitted by the semiconductor die is greater than 80%, whereas in other embodiments, a transmittance of the substrate for a wavelength emitted by the semiconductor die is greater than 80%. The substrate may comprise or consist essentially of polyethylene naphthalate, polyethylene terephthalate, polycarbonate, polyethersulfone, polyester, polyimide, polyethylene, and/or paper. The gap between the first and second traces may range between approximately 25 µm and approximately 1000 µm. An advantage of the invention is that there need be no heat sink in thermal communication with the semiconductor die.

In various embodiments, disposed over and at least partially surrounding the semiconductor die is a phosphor material for converting at least a portion of light emitted by the semiconductor die to light of a different wavelength. There may be a second substrate disposed over the yielding substrate and the first and second conductive traces, with the second substrate comprising an opening defined thereby; in such cases, the semiconductor die and the phosphor material may be disposed in the opening. Moreover, a transparent film may be disposed over the opening in the second substrate, which may be yielding.

In some embodiments, an optically transparent material is disposed between the semiconductor die and the phosphor material. A reflective surface for reflecting converted light toward the yielding substrate may be disposed over the phosphor material.

In another aspect, embodiments of the invention relate to an electronic device comprising a semiconductor die having first and second spaced-apart contacts on a first surface thereof, and a yielding substrate having first and second conductive traces on a first surface thereof in a bonding region; the first and second conductive traces defining a gap therebetween. Furthermore, the first and second contacts are adhered to and in electrical contact with, respectively, the first and second conductive traces with a pressure-activated adhesive material without electrically bridging the traces or the contacts; and at least in the bonding region, the height of the first and second traces above the first surface of the substrate does not exceed 10 µm (or, in some embodiments, does not exceed 5 µm, or in other embodiments, does not exceed 1 µm).

In still another aspect, the invention pertains to a method of forming an electronic device. In various embodiments, the method comprises providing a yielding substrate having first and second conductive traces on a first surface thereof in a bonding region, where the first and second conductive traces are separated on the substrate by a gap therebetween. With a pressure-activated adhesive material, the first and second contacts of a semiconductor die are adhered to the first and second traces, respectively, by applying pressure to at least one of the yielding substrate or the semiconductor die, thereby establishing electrical connection between (i) the first contact and the first trace and/or (ii) the second contact and the second trace, but without electrically bridging the traces or the contacts.

In some embodiments, the substrate is flexible but not deformable; in other embodiments, the substrate is deformable but not flexible; while in still other embodiments, the substrate is both flexible and deformable. Providing the substrate may, for example, comprise printing the first and second traces thereon. The adhesive may, in some embodiments, be cured. The first and second contacts may be co-planar or non-coplanar. Applying pressure to the yielding substrate and/or the semiconductor die may comprise compressing the substrate and the semiconductor die between a substantially rigid surface and a substantially compliant surface to adhere the first and second contacts to the first and second traces notwithstanding the non-coplanarity between the first and second contacts. Prior to adhering, the adhesive material may be provided on the first and second contact and/or the first and second traces. Providing the adhesive material may comprise dispensing the adhesive material in substantially liquid form. In various embodiments, the adhesive material comprises or consists essentially of an ACA. A non-conductive adhesive material may be formed over the yielding substrate within the gap.

In some embodiments, the method further comprises forming a phosphor material over at least a portion of the semiconductor die; the phosphor material converts at least a portion of light emitted by the semiconductor die to light of a different wavelength. A second substrate may, if desired, be disposed on the first surface of the yielding substrate; the second substrate defines an opening therethrough in which the semiconductor die is disposed. The opening may be at least partially filled with a phosphor material such that the phosphor material at least partially surrounds the semiconductor die.

A second substrate, comprising a depression in which the semiconductor die is disposed, may be formed on the first surface of the yielding substrate. A phosphor material may be disposed over a surface of the depression, and/or may be disposed between the semiconductor die and a reflective surface for reflecting the converted light toward the yielding substrate. The semiconductor die may be unpackaged, and may be, for example, a LED, e.g., an inorganic LED die. Alternatively, the semiconductor die may comprise or be a laser.

Providing the yielding substrate and adhering the contacts to the traces may be performed in a roll-to-roll process, for example. In various embodiments, using an adhesive material, the first and second contacts of a second semiconductor die are adhered to third and fourth conductive traces disposed on a second surface of the yielding substrate opposing the first surface. In some embodiments, the first and second contacts are substantially coplanar and, at least in the bonding region, the height of the first and second traces above the first surface of the substrate does not exceed 10 μm.

In yet another aspect, the invention pertains to an electronic device comprising, in various embodiments, a semiconductor die comprising a plurality of active semiconductor layers and a plurality of contacts. A first and a second of the active semiconductor layers collectively define a non-planar first surface to which a first and a second of the contacts are joined. The device further comprises a yielding substrate having first and second conductive traces on a first surface thereof, the first and second conductive traces being separated on the substrate by a gap therebetween. The first and second contacts are adhered to and in electrical contact with, respectively, the first and second conductive traces with a pressure-activated adhesive material notwithstanding the non-planarity of the first surface of the semiconductor die, and without electrically bridging the traces or the contacts. The semiconductor die may comprise or consist of a semiconductor substrate on which the plurality of active semiconductor layers is disposed. The plurality of active semiconductor layers may comprise or consist of a light-emitting quantum well disposed between the first and second active semiconductor layers.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. As used herein, the term "substantially" means±10%, and in some embodiments, ±5%.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
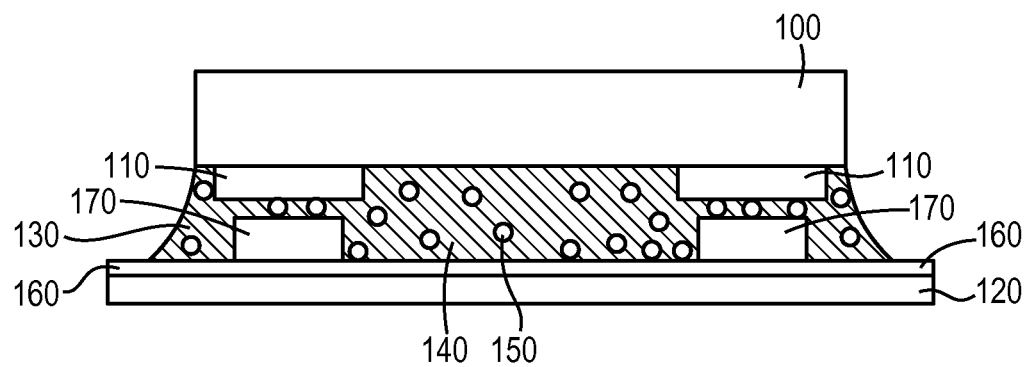
FIG. 1 is a schematic illustration of a semiconductor die bonded to stud bumps on a substrate via a pressure-activated adhesive in accordance with the prior art.
Figure 2:
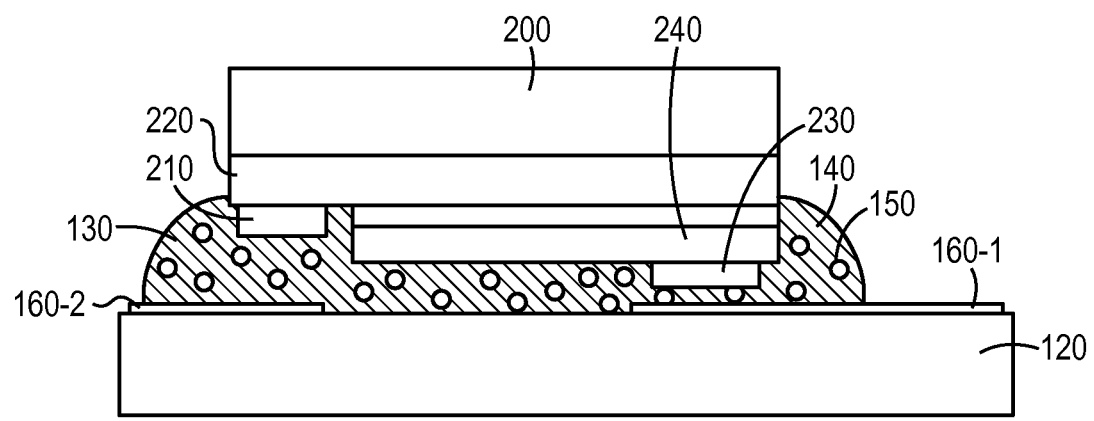
FIG. 2 is a schematic illustration of a semiconductor die bonded to a substrate via a pressure-activated adhesive in the absence of stud bumps, depicting the resulting unreliable or absent electrical connection.
Figure 3A:
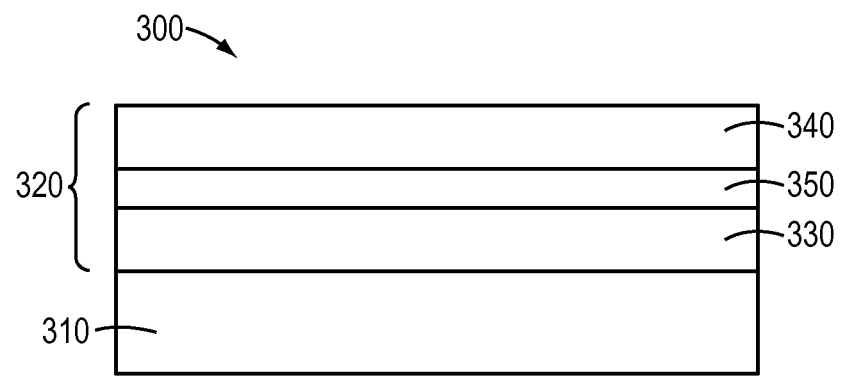
FIGS. 3A and 3B are schematic illustrations of a semiconductor die in different stages of processing, in accordance with various embodiments of the invention.
Figure 3B:
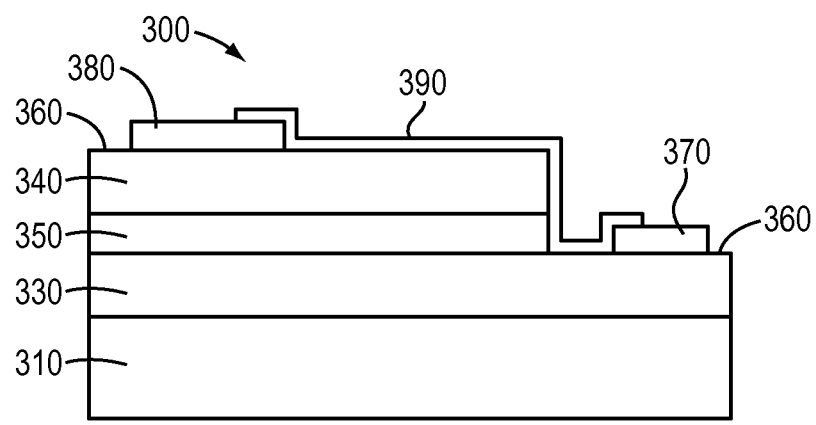

Refer first to FIGS. 3A and 3B, which depict an exemplary semiconductor die 300 for use in various embodiments of the present invention. Semiconductor die 300 typically includes a substrate 310 with one or more semiconductor layers 320 disposed thereover. In this exemplary embodiments, semiconductor die 300 represents a light-emitting device such as a LED or a laser, but other embodiments of the invention feature one or more semiconductor die with different or additional functionality, e.g., processors, sensors, detectors, and the like. Non-LED die may or may not be bonded as described herein, and may have contact geometries differing from those of the LEDs; moreover, they may or may not have semiconductor layers disposed over a yielding substrate as discussed below.

Substrate 310 may include or consist essentially of one or more semiconductor materials, e.g., silicon, GaAs, InP, GaN, and may be doped or substantially undoped (e.g., not intentionally doped). In some embodiments substrate 310 includes or consists essentially of sapphire or silicon carbide. Substrate 310 may be substantially transparent to a wavelength of light emitted by the semiconductor die 300. As shown for a light-emitting device, semiconductor layers 320 may include first and second doped layers 330, 340, which preferably are doped with opposite polarities (i.e., one n-type doped and the other p-type doped). One or more light-emitting layers 350, e.g., one or more quantum wells, may be disposed between layers 330, 340. Each of layers 330, 340, 350 may include or consist essentially of one or more semiconductor materials e.g., silicon. InAs, AlAs, GaAs, InP, AlP, GaP, InSb, GaSb, AlSb, GaN, AlN, InN, and/or mixtures and alloys (e.g., ternary or quaternary, etc. alloys) thereof. In preferred embodiments, semiconductor die 300 is an inorganic, rather than a polymeric or organic, device. As referred to herein, semiconductor dies may be packaged or unpackaged unless specifically indicated (e.g., a bare-die LED is an unpackaged semiconductor die). In some embodiments, substantially all or a portion of substrate 310 is removed prior to or after the bonding of semiconductor die 300 described below. Such removal may be performed by, e.g., chemical etching, laser lift-oft mechanical grinding and/or chemical-mechanical polishing or the like. In some embodiments all or a portion of substrate 310 may be removed and a second substrate—e.g., one that is transparent to or reflective of a wavelength of light emitted by semiconductor die 300—is attached to substrate 310 or semiconductor layers 320 prior to or after the bonding of semiconductor die 300 as described below. In some embodiments substrate 310 comprises silicon and all or a portion of silicon substrate 310 may be removed prior to or after the bonding of semiconductor die 300 described below. Such removal may be performed by, e.g., chemical etching, laser lift off, mechanical grinding and/or chemical-mechanical polishing or the like.

As shown in FIG. 3B, in preferred embodiments semiconductor die 300 is patterned and etched (e.g., via conventional photolithography and etch processes) such that a portion of layer 330 is exposed in order to facilitate electrical contact to layer 330 and layer 340 on the same side of semiconductor die 300 (and without, for example, the need to make contact to layer 330 through substrate 310 or to make contact to layer 330 with a shunt electrically connecting a contact pad over layer 340 to layer 330). One or more portions of layers 340, 350 are removed (or never formed) in order to expose a portion of layer 330, and thus FIG. 3B depicts a surface 360 of semiconductor die 300 that is non-planar, i.e., contains exposed portions non-coplanar with each other. Surface 360 corresponds to the outer surface of semiconductor die 300, including any contour or topography resulting from portions of layers not being present. In order to facilitate electrical contact to semiconductor die 300, discrete electrical contacts 370, 380 are formed on layers 330, 340, respectively. Electrical contacts 370, 380 may each include or consist essentially of a suitable conductive material, e.g., one or more metals or metal alloys conductive oxides, or other suitable conductive materials and are generally non-coplanar (particularly in embodiments when having approximately equal thicknesses), as depicted in FIG. 3B. In some embodiments, the vertical offset between exposed surfaces of layer 330 and layer 340 (and/or between contacts 370, 380) is at least 0.25 micrometers ($\mu$m), at least 1 $\mu$m, at least 3 $\mu$m, or even greater.

In some embodiments, semiconductor die 300 has a square shape, while in other embodiments semiconductor die 300 has a rectangular shape. In some preferred embodiments, to facilitate bonding (as described below) semiconductor die 300 may have a shape with a dimension in one direction that exceeds a dimension in an orthogonal direction (e.g., a rectangular shape), and have an aspect ratio of the orthogonal directions (length to width, in the case of a rectangular shape) of semiconductor die 300 greater than about 1.2:1. In some embodiments, semiconductor die 300 has an aspect ratio greater than about 2:1 or greater than 3:1. The shape and aspect ratio are not critical to the present invention, however, and semiconductor die 300 may have any desired shape.

In some embodiments, semiconductor die 300 has one lateral dimension less than 500 $\mu$m. Exemplary sizes of semiconductor die 300 may include ~250 $\mu$m×~600 $\mu$m. ~250 $\mu$m×~400 $\mu$m, ~250 $\mu$m×~300 $\mu$m, or ~225 $\mu$m×175 $\mu$m. In some embodiments, semiconductor die 300 comprises a small LED die, also referred to as a "MicroLED." A MicroLED generally has one lateral dimension less than about 300 $\mu$m. In some embodiments semiconductor die 300 has one lateral dimension less than about 200 $\mu$m or even less than about 100 $\mu$m. For example, a MicroLED may have a size of ~225 $\mu$m×~175 $\mu$m or ~150 $\mu$m×~100 $\mu$m or ~150 $\mu$m×~50 $\mu$m. In some embodiments, the surface area of the top surface of a MicroLED is less than 50,000 $\mu$m$^2$ or less than 10,000 $\mu$m$^2$.

Because preferred embodiments facilitate electrical contact to contacts 370, 380 via use of a conductive adhesive rather than, e.g., wire bonds, contacts 370, 380 may have a relatively small geometric extent since adhesives may be utilized to contact even very small areas impossible to connect with wires or ball bonds (which typically require bond areas of at least 80 $\mu$m on a side). In various embodiments, the extent of one or both of contacts 370, 380 in one dimension (e.g., a diameter or side length) is less than approximately 100 $\mu$m, less than approximately 70 $\mu$m, less than approximately 35 $\mu$m, or even less than approximately 20 $\mu$m.

Figure 3C:
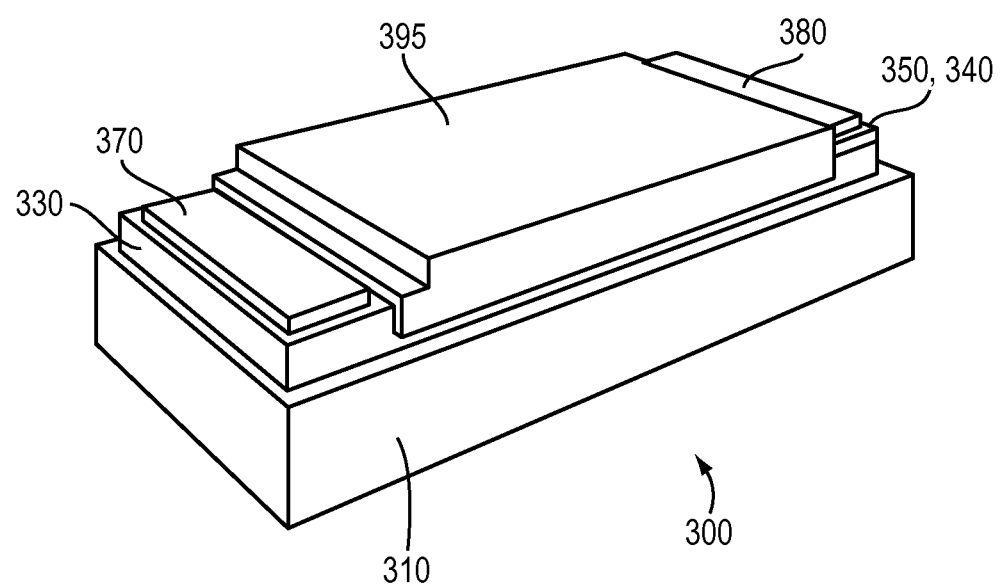
FIG. 3C is a schematic illustration of a semiconductor die, in accordance with an embodiment of the invention.

Particularly if semiconductor die 300 includes or consists essentially of a light-emitting device such as a LED or laser, contacts 370, 380 may be reflective (at least to some or all of the wavelengths emitted by semiconductor die 300) and hence reflect emitted light back toward substrate 310. In some embodiments, a reflective contact 380 covers a portion or substantially all of layer 340, while a reflective contact 370 covers a portion or substantially all of layer 330. In addition to reflective contacts, a reflector 390 (not shown in subsequent figures for clarity) may be disposed between or above portions of contacts 370, 380 and over portions or substantially all of layer 340 and 330. Reflector 390 is reflective to at least some or all wavelengths of light emitted by semiconductor die 300 and may comprise various materials. In one embodiment reflector 390 is non-conductive so as not to electrically connect contacts 370, 380. Reflector 390 may be a Bragg reflector. Reflector 390 may comprise one or more conductive materials, e.g., metals such as silver, gold, platinum, etc. Instead of or in addition to reflector 390, exposed surfaces of semiconductor die except for contacts 370, 380 may be coated with one or more layers of an insulating material, e.g., a nitride such as silicon nitride or an oxide such as silicon dioxide. In some embodiments contacts 370, 380 comprise a bond portion for connection to traces 410 and a current-spreading portion for providing more uniform current through semiconductor die 300, and in some embodiments, one or more layers of an insulating material are formed over all or portions of semiconductor die 300 except for the bond portions of contacts 370, 380. FIG. 3C shows a schematic of die 300 with insulating material 395 covering the surface of semiconductor die 300 except for contacts 370, 380. Insulating material 395 may comprise or consist essentially of, for example, silicon nitride, silicon oxide and/or silicon dioxide. Such insulating material 395 may cover all or portions of the top and sides of semiconductor die 300 as well as portions of the top and sides of layers 330, 340 and 350. Insulating material 395 may act to prevent shorting between contacts 370 and 380 or between traces 410 (see FIG. 4), or both during and after the bonding operation with adhesive.

With reference to FIGS. 3A, 3B, 3C and 4, semiconductor die 300 operates at a current and temperature sufficiently low to prevent melting or other damage to adhesive 510 or to the substrate 400. For example, the operating current of semiconductor die 300 may be less than approximately 50 mA, 10 mA or in some embodiments less than 5 mA. In some embodiments the operation current is between approximately 1 mA and approximately 5 mA. The junction temperature of semiconductor die 300 during operation may not exceed approximately 100° C., 90° C. or may not exceed 80° C. It should be understood, however, that this is not critical to the present invention and in other embodiments the junction temperature may be any value that does not damage or otherwise adversely affect substrate 400, adhesive 510 or other components of the system. Substrates such as PEN, for example, can withstand higher temperatures than PET, and those of skill in the art can straightforwardly choose a substrate material appropriate to a particular application.

In preferred embodiments, the small size of semiconductor die 300, particularly of an unpackaged semiconductor die 300, and its abovementioned relatively low operating current and temperature, obviate the need for a relatively high thermal conductivity substrate as is conventionally used, for example a ceramic substrate (such as $Al_2O_3$, AlN or the like) or metal-core printed circuit board (MCPCB) or a discrete or integrated heat sink (i.e., a highly thermally conductive fixture (comprising, for example, metal or ceramic materials) such as a plate or block, which may have projections such as fins to conduct heat away and into the surrounding ambient) to be in thermal communication with semiconductor die 300. Rather, substrate 400 itself (as well as, e.g., the adhesive, the traces, and even the surrounding ambient itself) provides adequate conduction of heat away from semiconductor die 300 during operation.

In various preferred embodiments, one or more of the semiconductor dies 300 on the substrate 400 are light-emitting devices such as LEDs and/or lasers. Conventional light-emitting assemblies are designed to maximize the amount of light emitted per area. Such designs, which involve increasing the amount of light emitted by each individual device, necessarily result in an increase in the amount of heat generated by each device and thus typically require a low-thermal-resistance pathway from the device (e.g., the LED junction) to ambient. These light-emitting assemblies may minimize the thermal resistance along the thermal pathway between the semiconductor die (e.g., a LED and the junction of the LED) and the surrounding ambient via the use of expensive materials and/or complicated thermal-management schemes, e.g., high-thermal-conductivity ceramics, thermal contact pads, metal-core circuit boards, large heat sinks, and even active cooling devices such as fans. Such devices frequently have thermal resistances of less than 2.5° C./Watt (° C./W), or even less than 1° C./W.

For example the Cree XM-L packaged LED, which is representative of high-brightness packaged LEDs, has a thermal resistance from the junction to the solder point of 2.5° C./W. The Cree thermal management guide CLD-AP05 REV 2 states that with good design, the thermal resistance from the solder point to the heat sink can be minimized to less than 1° C./W. The thermal resistance from the heat sink to ambient for a given allowed junction temperature can then be calculated as follows:

$$R_{th.hs\text{-}a}=(T_{jmax}-T_a-R_{th.j\text{-}s}\times I\times V-R_{th.s\text{-}hs}\times I\times V)/(I\times V)$$

where $R_{th.hs\text{-}a}$ is the thermal resistance from heat sink to ambient, $T_{jmax}$ is the maximum junction temperature, $T_a$ is the ambient temperature, $R_{th.j\text{-}s}$ is the thermal resistance from the junction to the solder point, I is the LED current, V is the LED voltage and $R_{th.s\text{-}hs}$ is the thermal resistance from the solder point to the heat sink. If we allow $T_n$ to be 55° C., and state that $T_{jmax}=150°$ C. (from the Xm-L spec sheet), and we operate the LED at 1 A and 6 V, the LED power is 6 watts. The required heat sink must then have a $R_{th.hs\text{-}a}$ of 12° C./W. Thus the total thermal resistance from junction to ambient is 2.5+1+12=15.5° C./W. LEDs that emit relatively smaller amounts of light use packages with relatively higher thermal resistance. For example, parts designed to operate at about 20 mA typically have a thermal resistance in the range of about 300° C./W.

In contrast, embodiments of the invention feature a high thermal resistance along the pathway from the semiconductor die 300 to the surrounding ambient. This high thermal resistance may apply to each individual component along the pathway, e.g., the substrate 400, the adhesive 510, the traces 410, etc., and/or may apply collectively to the entire pathway. Specifically, the thermal resistance along the pathway and/or of one or more of the components along the pathway may be greater than approximately greater than approximately 500° C./W, greater than approximately 1000° C./W, or even greater than approximately 2000° C./W.

For example, in one embodiment the thermal resistance from the p-n junction of the LED 300 to the adjacent trace 400 (in this example, silver) over substrate 400 (in this example, 5 mil thick PET) was measured to be approximately 1800-2000° C./W. Part of the heat is dissipated by trace 400 and part of it flows through and is radiated out the back of the substrate 400. PET film has a thermal resistance in the range of 8-18° C.-$cm^2$/W. The die size used in this example was is 250 µm×600 µm. If we assume that the area through which the heat flows is 1 mm on a side, the area is 1 $mm^2$ and thus the thermal resistance of the PET is 13° C.-cm/W (average thermal resistance) divided by the area (0.01 $cm^2$) or 13° C./W. Using an area of 1 $mm^2$ is overly conservative given the small size of the die and the fact that the PET sheet is only 5 mil thick. Using a trapezoidal approximation, with the heat radiating at a 50° angle, and taking the area as the average of the die size and the projection on the back surface of the PET gives an area of 0.005 cm². Using this area gives a thermal resistance of about 2600° C./W. Thus, in this example, the thermal resistance is at least 2000° C./W, and for the portion of the heat removed through the PET, at least 4500° C./W.

Based on these calculations, embodiments of the present invention have a thermal resistance to ambient that is at least 100 times larger than that of conventional high-brightness LEDs. Furthermore, this can be achieved in certain embodiments with relatively low junction temperatures, e.g., below 100° C. In some embodiments, when semiconductor die 300 comprises a p-n junction, the distance between the p-n junction and the surface of substrate 400 over which trace 410 is formed may be less than 100 μm, or less than 50 μm or less than 30 μm. In some embodiments, when semiconductor die 300 comprises a LED, the distance between layer 350 (see FIG. 3B) and the surface of substrate 400 over which trace 410 is formed may be less than 100 μm, or less than 50 μm or less than 30 μm. In some embodiments, when semiconductor die 300 comprises a device other than a LED, the distance between the heat generating region of semiconductor die 300 and the surface of substrate 400 over which trace 410 is formed may be less than 100 μm, or less than 50 μm or less than 30 μm. In some embodiments a shorter distance between the p-n junction or the heat-generating region of semiconductor die 300 and the surface of substrate 400 over which trace 410 is formed may be employed in order to reduce the thermal resistance between the p-n junction (or the heat-generating region of semiconductor die 300) and the ambient.

Embodiments of the present invention involve lighting assemblies comprising light-emitting semiconductor die attached to yielding substrates using adhesives. Such assemblies comprise an array of light-emitting elements disposed over substrate 400. In some embodiments, the light-emitting elements are disposed over substrate 400 in a two-dimensional array with a pitch in the range of about 3 mm to about 30 mm. For embodiments employing light-emitting semiconductor die 300, the overall lighting assembly or module may produce at least 100 lumens, at least 1000 lumens, or even at least 3000 lumens, and/or may have a density of semiconductor die 300 greater than approximately 0.25 die/cm² of area over which the semiconductor die 300 are disposed. Such light-emitting systems may feature semiconductor die 300 having junction temperatures less than 100° C., or even less than 80° C. And, the heat density of such systems may be less than 0.01 W/cm² of area over which the semiconductor die 300 are disposed. Furthermore, the heat density generated by systems in accordance with embodiments of the invention may be less than approximately 0.01 W/cm², or even less than approximately 0.005 W/cm², whereas conventional light-emitting devices typically have heat densities greater than approximately 0.3 W/cm², or even greater than approximately 0.5 W/cm².

In one conventional approach, for example, a lighting assembly has one LED and the area is the area of the printed circuit board (PCB) for that LED. A similar definition may be used for lighting assemblies with multiple LEDs, that is, the area is the PCB area over which the LEDs are disposed. Based on this, a comparison between the present invention and the prior art can be made using a 2'×2' troffer which is conventionally illuminated with fluorescent lamps. The prior-art approach to replacing the fluorescent lamps with LEDs is to use a PCB that is significantly smaller than the entire light-emitting area in combination with optical components to spread out the light. This may be accomplished by edge lighting an optical element, in which case the PCB for the LEDs may have dimensions on the order of 0.25" by 24" long, for an area of 6 in², or 38.7 cm². In the case of LED-based fluorescent replacement lamps (a lighting structure with a similar form factor to a fluorescent lamp, but that produces light using LEDs), the PCB may be on the order of 24" by 1", for an area of 24 in², or about 155 cm². These dimensions are assumed for what would be required for a 2'×2' troffer. Assuming two boards, the board area is no more than about 500 cm². This value is on the high side for tube replacements and much larger than for the edge lighting approach. For embodiments of the present invention the area is that of the entire 2'×2' troffer, which is 576 in², or 3716 cm², larger by a factor of at least 7. Assuming that the LEDs in these luminaires have an efficiency of 100 lm/W, before taking into account the power supply efficiency, generation of 3500 lumens, which is a standard luminous flux for a 2'×2' troffer, will require 35 watts. If the LEDs are 50% efficient, then about 17 watts of heat is generated. In the conventional case, the heat density is greater than 0.034 W/cm² for the tube replacement and about five times larger for the edge lighting approach, while embodiments of the present invention may achieve a heat density on the order of 0.0045 W/cm²—almost a factor of 10 less than that for the conventional approach. The much smaller heat density achievable using the present invention, relative to the heat density of the prior art, permits operation of lighting assemblies or modules without additional heat sinking.

Figure 4:
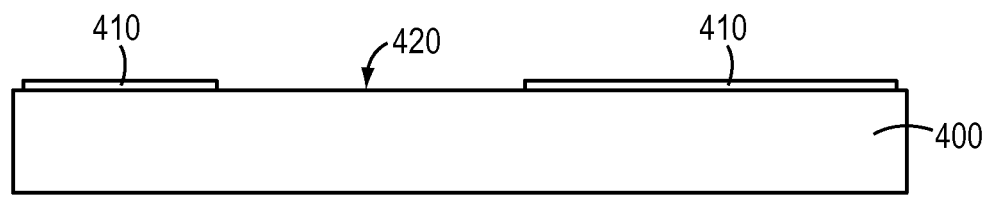
FIG. 4 is a schematic illustration of a yielding substrate utilized in accordance with various embodiments of the invention.
Figure 5A:
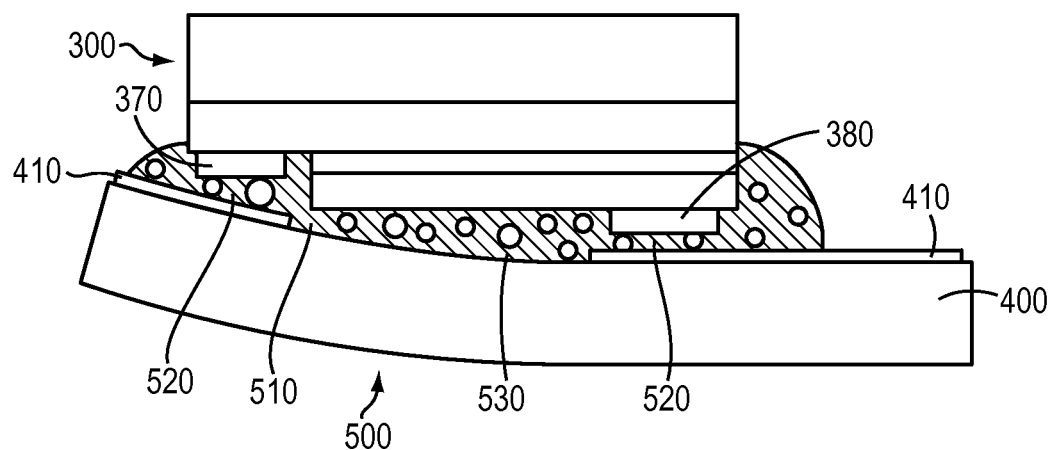
FIGS. 5A and 5B are schematic illustrations of a semiconductor die adhered to a yielding substrate in accordance with various embodiments of the invention.
Figure 5B:
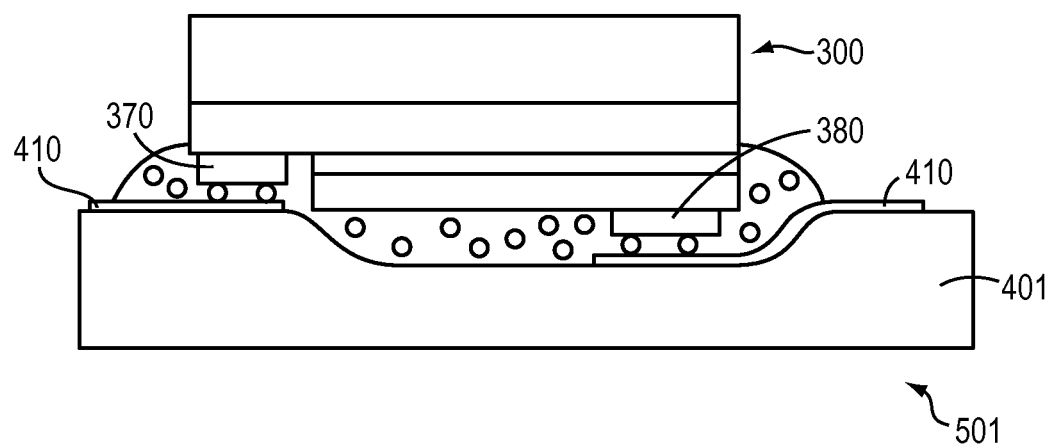

FIG. 4 depicts an exemplary substrate 400 for use in various embodiments of the present invention. Substrate 400 is preferably yielding, i.e., flexible and/or deformable, and may be flexible or rigid to permit electrical coupling between contacts on the semiconductor die and traces on the substrate using pressure-activated adhesive—even in embodiments where the contacts on the semiconductor die are non-planar—without damaging the semiconductor die. This may be achieved, for example, by the substrate flexing as shown in FIG. 5A or deforming as shown in FIG. 5B. Such deformation may be elastic (returning to the original shape after the load is removed) or plastic deformation (maintaining permanent deformation after the load is removed) or a combination of elastic and plastic deformation. In various embodiments, the substrate may both flex and deform. In some embodiments, substrate 400 is flexible and has a radius of curvature of about 1 m or less, or about 0.5 m or less, or even about 0.1 m or less. In some embodiments, substrate 400 has a Young's Modulus less than about 100 N/m², less than about 50 N/m², or even less than about 10 N/m². In some embodiments, substrate 400 has a Shore A hardness value less than about 100; a Shore D hardness less than about 100; and/or a Rockwell hardness less than about 150.

Substrate 400 may include or consist essentially of a semicrystalline or amorphous material, e.g., polyethylene naphthalate (PEN), polyethylene terephthalate (PET), polycarbonate, polyethersulfone, polyester, polyimide, polyethylene, and/or paper. Substrate 400 may comprise multiple layers, e.g., a deformable layer over a rigid layer, for example, a semicrystalline or amorphous material, e.g., PEN, PET, polycarbonate, polyethersulfone, polyester, polyimide, polyethylene, and/or paper formed over a rigid substrate for example comprising, acrylic, aluminum, steel and the like. Depending upon the desired application for which embodiments of the invention are utilized, substrate 400 may be substantially optically transparent, translucent, or opaque. For example, substrate 400 may exhibit a transmittance or a reflectivity greater than 80% for optical wavelengths ranging between approximately 400 nm and approximately 600 nm. In some embodiments substrate 400 may exhibit a transmittance or a reflectivity of greater than 80% for one or more wavelengths emitted by semiconductor die 300. Substrate 400 may also be substantially insulating, and may have an electrical resistivity greater than approximately 100 ohm-cm, greater than approximately $1 \times 10^6$ ohm-cm, or even greater than approximately $1 \times 10^{10}$ ohm-cm.

As shown in FIG. 4, at least two conductive traces 410 are disposed on the substrate 400 to provide electrical connectivity to a device or die connected to the traces. The traces 410 are spaced apart, defining a gap 420 therebetween that may be sized based on the size of the device or die and contact spacings on the device or die to be connected to the traces. For example, the gap 420 may range between approximately 25 μm and approximately 1000 μm. The traces 410 preferably include or consist essentially of one or more conductive materials, e.g., a metal or metal alloy, carbon, etc. Traces 410 may be formed via conventional deposition, photolithography, and etching processes, plating processes, or may be formed using a variety of printing processes. For example, traces 410 may be formed via screen printing, flexographic printing, ink-jet printing, and/or gravure printing. The traces 410 may include or consist essentially of a conductive ink, which may include one or more elements such as silver, gold, aluminum, chromium, copper, and/or carbon. As mentioned above, preferred embodiments of the invention do not utilize stud bumps or similar conductive projections over traces 410; therefore, the distance between substrate 400 and a device bonded to substrate 400 is at least in part defined by the thickness of traces 410 (which are typically equal to each other). This thickness of traces 410 is preferably less than approximately 10 μm, and even more preferably less than approximately 5 μm. While the thickness of one or more of the traces 410 may vary, the thickness is generally substantially uniform along the length of the trace to simplify processing. However this is not a limitation of the present invention and in other embodiments the trace thickness or material may vary on substrate 400.

Referring to FIG. 5A, in various embodiments semiconductor die 300 is bonded (i.e., attached) to substrate 400. In order to enable electrical connectivity to semiconductor die 300, contacts 370, 380 are typically adhered to (e.g., directly to) and in electrical contact with traces 410. As shown in FIG. 5A with a yielding substrate 400, strong reliable bonds between the traces and the contacts are achieved by flexing (i.e., bending or deforming) at least in a region 500 between the traces 410. Substrate 400 may flex such that the distances between each of contacts 370, 380 and its corresponding trace 410 (to which it is adhered) are approximately equal. In preferred embodiments, the contacts 370, 380 are adhered to traces 410 via a pressure-activated adhesive 510. For example, adhesive 510 may include or consist essentially of a pressure-activated ACA, and thus contacts 370, 380 may be electrically connected to traces 410 via conductive structures such as particles within the ACA, while the contacts 370, 380 are electrically insulated from each other (as are the traces 410).

In another embodiment, shown in FIG. 5B, electrical conductivity is enabled by deformation of substrate 401. In this embodiment, a portion of semiconductor die 300 or contacts 370, 380 deforms a portion of substrate 401 in region 501 and by such deformation electrical conductivity between traces 410 and contacts 370, 380 is enabled. In FIG. 5B, substrate 401 is shown as deforming only in the surface region, with no deformation of the face of substrate 401 opposite the face over which conductive traces 410 are formed. This is not necessary to the present invention, however, and in other embodiments, deformation may occur on both faces of substrate 401. Indeed, the substrate may both flex and deform, combining the behavior illustrated in FIGS. 5A and 5B.

If substrate 400 is too soft, pressure applied across semiconductor die 300 and substrate 400 may result in deformation of substrate 400 without sufficient force being applied to the ACA to establish electrical connection between traces 410 and contacts 370, 380. If substrate 400 is too hard, on the other hand, pressure applied across semiconductor die 300 and substrate 400 may result in fracture or breaking of semiconductor die 300 before the ACA is able establish electrical connection between traces 410 and contacts 370, 380. Thus the required level of deformability for substrate 400 may also depend on the mechanical properties of semiconductor die 300; tougher semiconductor die 300 may permit use of relatively less deformable substrate 400. Conversely, more fragile semiconductor die 300 may require use of a relatively more deformable substrate 400. Those of skill in the art may straightforwardly determine, without undue experimentation, the appropriate degree of substrate hardness for a particular semiconductor die. In some applications, the toughness of semiconductor die may be varied by changing its thickness or the materials from which it is fabricated.

During the bonding of semiconductor die 300 to substrate 400, adhesive 510 may be dispensed in substantially liquid form, i.e., as a paste or a gel, as opposed to a solid such as a tape. The adhesive 510 may be dispensed over portions of semiconductor die 300 (e.g., at least portions of contacts 370, 380) or substrate 400 (e.g., at least portions of traces 410) or both. Contacts 370, 380 are then brought into physical proximity (or contact) with and adhered to traces 410 via application of pressure to semiconductor die 300, substrate 400, or both. Because adhesive 510 in some embodiments is an ACA, perfect alignment between contacts 370,380 and traces 410 is not necessary, thus simplifying the process. When using an ACA, perfect alignment is not required because conduction occurs only in the vertical direction between contacts 370, 380 and traces 410, and not laterally between contacts 370, 380 or between traces 410. In one embodiment, semiconductor die 300 and substrate 400 are compressed between a substantially rigid surface and a substantially compliant surface, thereby enabling the flexure or deformation or both of substrate 400 depicted in FIGS. 5A and 5B and the resulting electrically conductive and reliable bond to semiconductor die 300 notwithstanding the nonplanarity of surface 360 and/or the non-coplanarity between contacts 370, 380.

After or during the compression of semiconductor die 300 and substrate 400 (and, in preferred embodiments, pressure-induced activation of adhesive 510), adhesive 510 is cured by, e.g., application energy, for example heat and/or ultraviolet light. For example, adhesive 510 may be cured by heating to a temperature ranging from approximately 80° C. to approximately 150° C., e.g., approximately 125° C., for a period of time ranging from approximately several seconds to 1 minute to approximately 30 minutes, e.g., approximately 10 minutes, depending on the properties of the adhesive.

In another embodiment, the adhesive 510 comprises an isotropically conductive adhesive in regions 520 between contacts 370, 380 and their respective traces 410. In such embodiments, in a region 530 between the traces 410 and between contacts 370, 380, insulation may be maintained via absence of adhesive 510 or via the presence of a second, non-conductive adhesive. Adhesive 510 preferably features a polymeric matrix, rather than a fully metallic one that might result in undesirable electrical shorting between contacts 370, 380 and/or between traces 410. In some embodiments adhesive 510 may be reflective to at least some or all wavelengths of light emitted by semiconductor die 300.

Figure 6A:
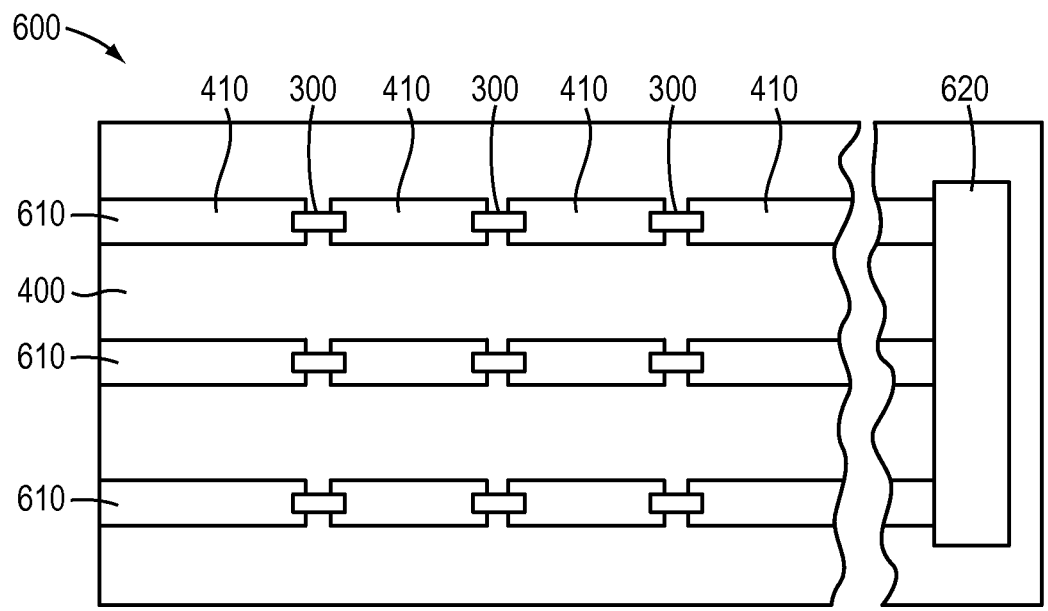
FIG. 6A is a schematic top view of an electronic device featuring multiple semiconductor dies adhered to a yielding substrate as shown in FIG. 5, in accordance with various embodiments of the invention.

FIG. 6A depicts an electronic device 600 featuring an array of semiconductor die 300 adhered between conductive traces 410 as described above. As shown, electronic device 600 includes three serially-connected strings 610 of semiconductor dies 300. Electronic device 600 also includes circuitry 620 electrically connected to one or more of the strings 610. The circuitry 620 may include or consist essentially of portions of (in the case, for example, of a distributed power supply/driver) or portions of or substantially all of drive circuitry, sensors, control circuitry, dimming circuitry, and or power-supply circuitry or the like, and may also be adhered (e.g., via an adhesive) or otherwise attached to substrate 400. Circuitry 620 may even be disposed on a circuit board (e.g., a printed circuit board) that itself may be mechanically and/or electrically attached to substrate 400. In other embodiments circuitry 620 is separate from substrate 400. While FIG. 6A depicts the semiconductor die 300 serially connected in strings 610, and strings 610 connected or connectable in parallel (see also FIGS. 7A and 7B), other die-interconnection schemes are possible and within the scope of the invention.

Furthermore, one or more semiconductor die 300 may be bonded to traces 410 on the back side of substrate 100 in a similar or different fashion to that depicted in FIG. 6A, and/or multiple substrates 400 having semiconductor dies 300 and traces 410 thereon may be stacked to form multi-layer devices. In these embodiments, with die on the front and back of substrate 400 or multiple substrates 400, the die within as well as on each layer may all be the same or may be different; for example, semiconductor die 300 on different layers may emit at different wavelengths. In devices having semiconductor die 300 on the substrate back side or disposed in multiple layers, each layer may have its own dedicated circuitry 620, or all or part of circuitry 620 may be shared among layers and/or groups of semiconductor die 300. The circuitry 620 may include or consist essentially all or portions of any of the embodiments described in U.S. patent application Ser. No. 12/982,758, filed on Dec. 30, 2010, the entire disclosure of which is incorporated by reference herein. In some embodiments, semiconductor die and/or circuit elements on the back or front, or on multiple layers of substrate 400 may be electrically coupled together.

Since electronic device 600 may be based on a yielding substrate 400, it may be formed in a roll-to-roll process, in which a sheet of the yielding substrate material travels through different processing stations. Such roll-to-roll processing may, for example, include the formation of traces 410, dispensing of the adhesive 510, and the placement of semiconductor dies 300, as well as for the bonding of any additional substrates and/or formation of one or more phosphor materials (as detailed below). In addition, electronic device 600 may also include other passive and/or active electronic devices attached to substrate 400, including, e.g., sensors, antennas, resistors, inductors, capacitors, thin-film batteries, transistors and/or integrated circuits. Such other passive and/or active electronic devices may be electrically coupled to traces or semiconductor dies 300 with adhesive 510 or by other means.

Figure 6B:
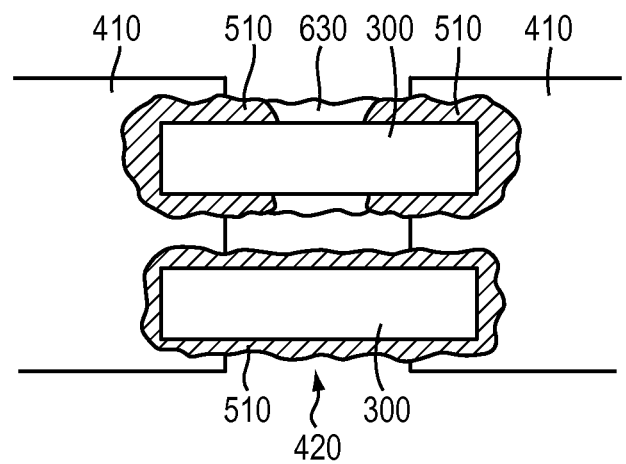
FIG. 6B is a magnified top view of multiple semiconductor dies adhered between conductive traces in an electronic device similar to that depicted in FIG. 6A, in accordance with various embodiments of the invention.

Furthermore, as shown in FIG. 6B, two or more semiconductor dies 300 may be connected in parallel to the same traces 410 (i.e., within the same gap 420 between traces), thus providing enhanced functionality and/or redundancy in the event of failure of a single semiconductor die 300. In a preferred embodiment, each of the semiconductor dies 300 adhered across the same gap 420 is configured not only to operate in parallel with the others (e.g., at substantially the same drive current), but also to operate without overheating or damage at a drive current corresponding to the cumulative drive current operating all of the semiconductor dies 300 disposed within a single gap. Thus, in the event of failure of one or more of the semiconductor dies 300 adhered across the gap 420, the remaining one or more semiconductor dies 300 will continue to operate at a higher drive current. For example, for semiconductor dies 300 including or consisting essentially of light-emitting devices such as LEDs or lasers, the failure of a device connected in parallel to one or more other devices across the same gap results in the other device(s) operating at a higher current and thus producing light of increased intensity, thereby compensating for the failure of the failed device.

FIG. 6B also illustrates two of the different adhesion schemes described above. One of the semiconductor dies 300 is adhered to the traces 410 via adhesive 510 only at the ends of the die, while between the ends within the gap between traces, a second adhesive 630 (which is preferably non-conductive) adheres the middle portion of the semiconductor die 300 to substrate 400. In some embodiments the second adhesive 630 is non-conductive and prevents shorting between the two portions of conductive adhesive 510 and/or between traces 410 and/or between the two contacts of die 300. As shown, the other semiconductor die 300 is adhered between the traces 410 with adhesive 510 contacting the entirety of the bottom surface of semiconductor die 300. As described above, adhesive 510 is preferably a pressure-activated ACA that permits electrical conduction only in the vertical direction (out of the plane of the page in FIG. 6B) but insulates the traces 410 from each other. In other embodiments, one or more semiconductor dies 300 are adhered between traces 410 within the same gap 420, but there is sufficient "real estate" within the gap 420 (including portions of the traces 410) to adhere at least one additional semiconductor die 300 within the gap 420. In such embodiments, if the one or more semiconductor dies 300 initially adhered within the gap 420 fail, then one or more semiconductor dies 300 (substantially identical to or different from any of the initial semiconductor dies 300) may be adhered within the gap 420 in a "rework" process. For example, referring to FIG. 6B, only one of the depicted semiconductor dies 300 may be initially adhered to the traces 410, and the other semiconductor die 300 may be adhered later, e.g., after failure of the initial die.

Figure 7A:
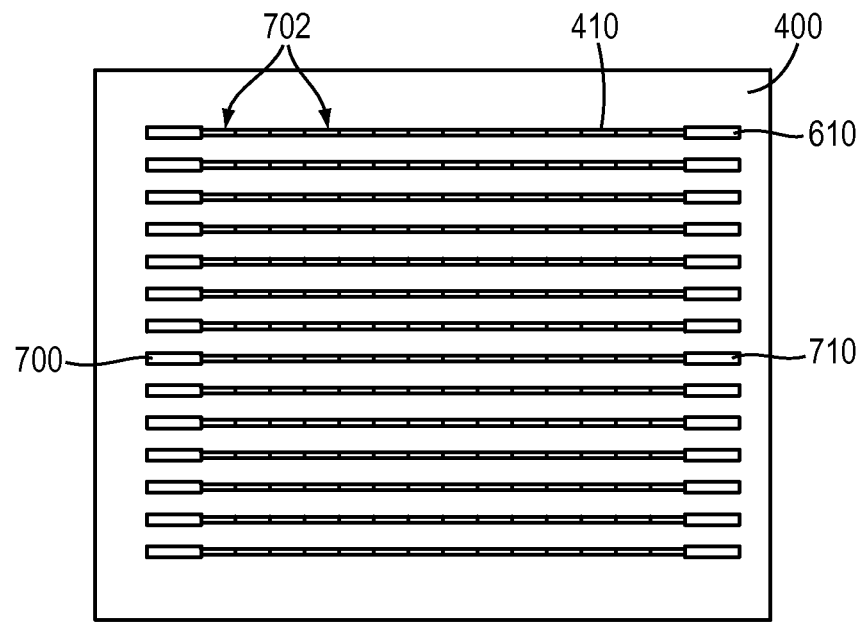
FIGS. 7A and 7B are schematic top views of layouts of electrical traces utilizes in electronic devices in accordance with various embodiments of the invention.
Figure 7B:
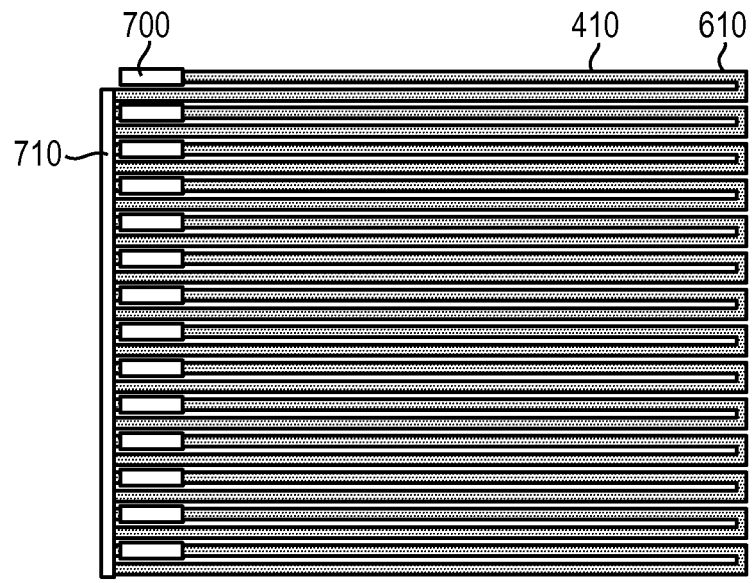

FIGS. 7A and 7B schematically depict two different layouts of electrical traces 410 that may be utilized in electronic devices in accordance with various embodiments of the invention. Much as in FIG. 6A, FIGS. 7A and 7B depict parallel strings 610 of traces 410 configured to interconnect multiple semiconductor dies 300 in series (while the gaps 702 representing bonding locations for the semiconductor dies 300 are shown in FIG. 7A they are omitted in FIG. 7B for clarity). In FIG. 7A, each string 610 has a contact 700 at one end and a contact 710 at the other. In various embodiments, contact 700 is a "drive" contact for applying operating current or voltage to the semiconductor dies 300, while contact 710 is a "common" or ground contact. In FIG. 7B, each string 610 extends across substrate 400 and turns back to extend back to a point near its starting point, enabling both contacts 700, 710 to be placed on one side of substrate 400. As also shown in FIG. 7B, either or both of contacts 700, 710 for multiple strings 610 may be connected together into a shared contact (as shown of contacts 710 in FIG. 7B); such schemes may simplify layout and interconnection of the semiconductor dies 300 and/or strings 610. While the layouts depicted in FIGS. 7A and 7B position the semiconductor dies 300 in a square or rectangular grid, the semiconductor dies 300 may be arranged in other ways. Likewise, the traces 410 may be substantially straight, as shown, or may be curved, jagged, non-parallel, or be arranged in other ways.

Figure 8A:
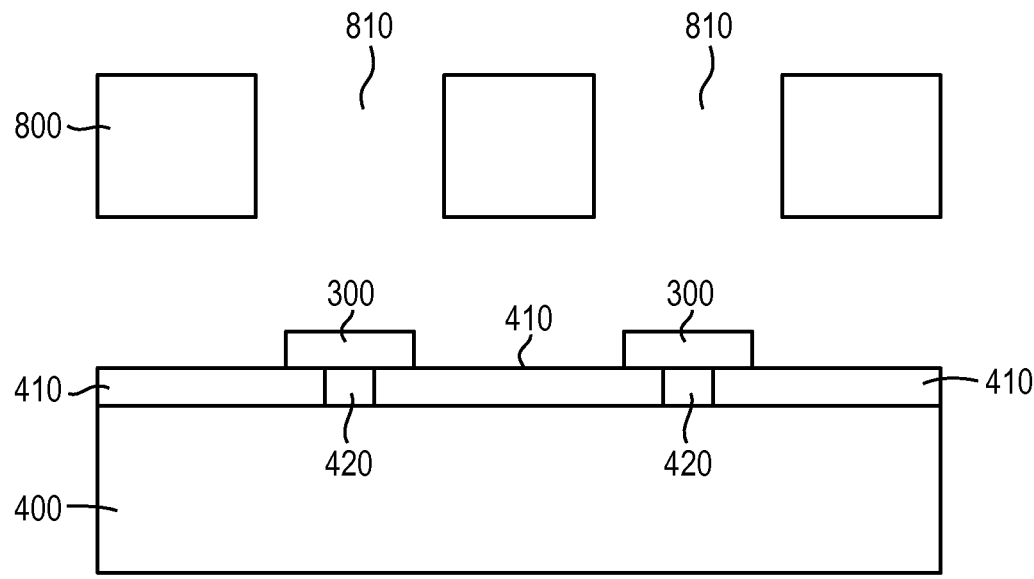
FIGS. 8A-8D are schematic cross-sections of the integration of phosphor with semiconductor dies adhered to a substrate in accordance with various embodiments of the invention.
Figure 8B:
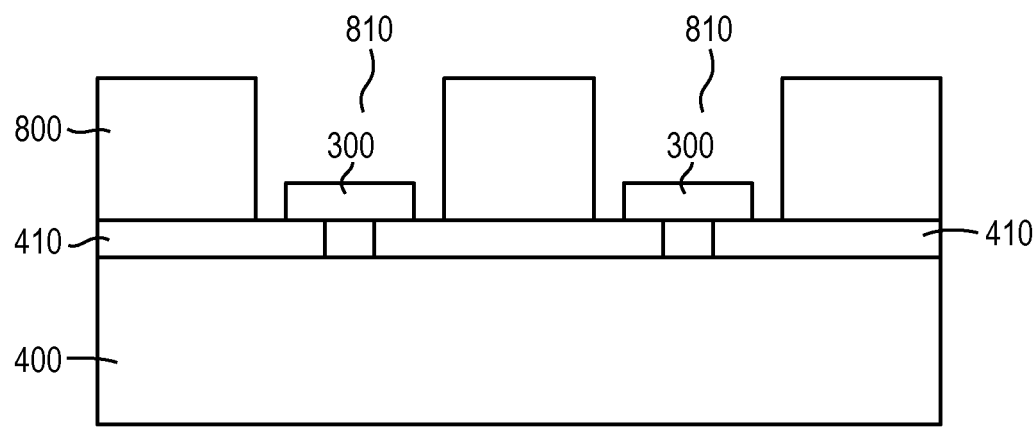

In embodiments in which one or more of the semiconductor dies 300 is a light-emitting device such as a LED or a laser, a phosphor material may be incorporated to shift the wavelength of at least a portion of the light emitted by the die to another desired wavelength (which is then emitted from the larger device alone or color-mixed with another portion of the original light emitted by the die). As used herein, "phosphor" refers to any material that shifts the wavelength of light irradiating it and/or that is luminescent, fluorescent, and/or phosphorescent. Phosphors comprise powders or particles and in such case may be mixed in binders, e.g., silicone. As used herein, phosphor may comprise the powder or particles or to the powder or particles plus binder. FIGS. 8A-8D depict an exemplary procedure for integrating phosphors with the semiconductor dies 300 adhered to a yielding substrate 400. FIG. 8A depicts a cross-sectional view of two semiconductor dies 300 adhered to a substrate 400, each across a gap 420 between two conductive traces 410 (flexure and/or deformation of substrate 400, any non-planarity of the semiconductor dies 300, and the adhesive 510 have been omitted from the figures for clarity). A substrate 800 having an opening 810 (which preferably extends through the entire thickness of substrate 800) corresponding to one or more of the semiconductor dies 300 on substrate 400 is provided (FIG. 8A) and bonded to substrate 400 such that one or more of the semiconductor dies 300 is positioned within an opening 810 (FIG. 8B), The substrate 800 may be yielding or substantially rigid, and may include or consist essentially of materials such as polyethylene naphthalate, polyethylene terephthalate, polycarbonate, polyethersulfone, polyester, polyimide, polyethylene, and/or paper.

Figure 8C:
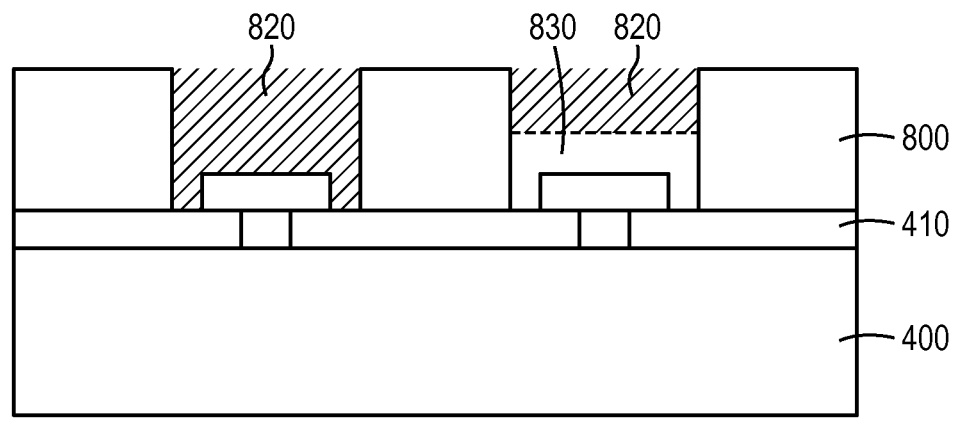

As shown in FIG. 8C, the openings 810 in substrate 800 form "wells" around semiconductor dies 300. After substrate 800 is bonded to substrate 400, a phosphor 820 is provided within one or more of the openings 810 such that phosphor 820 is disposed over and at least partially surrounds (e.g., is on one or more sides of, but not necessarily in contact with) the semiconductor die 300 in the opening 810. As shown, the phosphor 820 may substantially fill the opening 810, and may be in contact with semiconductor die 300. In other embodiments, an optically transparent material 830 (e.g., silicone or epoxy) is provided within and partially fills one or more of the openings 810 before the phosphor 820 is disposed within (and may substantially fill the remainder of) the opening 810 (see the right opening 810 in FIG. 8C). This "remote phosphor" arrangement positions the phosphor 820 at a distance from the semiconductor die 300, which may prevent the operation of semiconductor die 300 from deleteriously heating the phosphor 820, thus extending its lifespan and/or improving its efficiency. In some embodiments, openings 810 are not completely filled with phosphor 820 or clear material 830, whereas in other embodiments, openings 810 are over-filled with phosphor 820 or clear material 830. Openings 810 may not have any phosphor 820 and/or may not have any clear material 830. In some embodiments, multiple optically transparent and phosphor materials are formed in layers or other configurations.

Figure 8D:
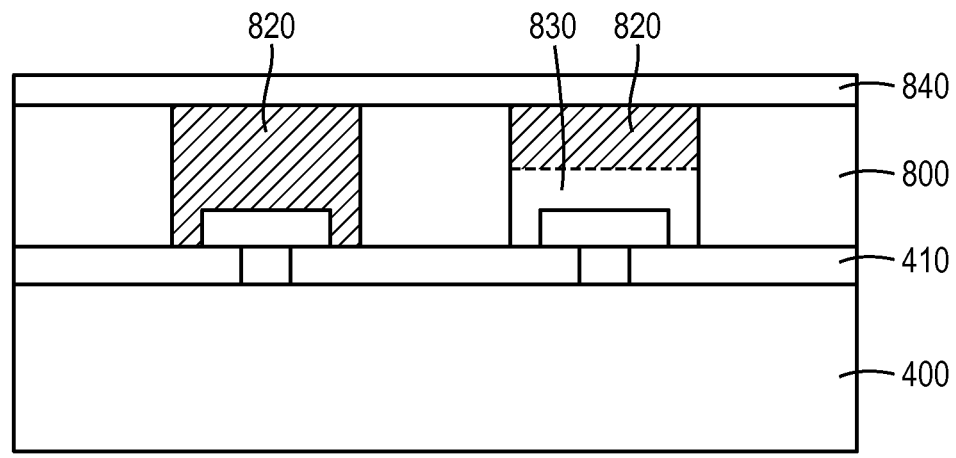

As shown in FIG. 8D, a protective film 840 may be optionally placed over substantially all of substrate 800 and openings 810, or at least over openings 810 having phosphor 820 and/or clear material 830 therewithin, thereby protecting the phosphor 820 and/or the semiconductor dies 300 from the surrounding ambient, moisture, and the like. The film 840 may be transparent, or may be reflective such that the light emitted by semiconductor die 300 and shifted by the phosphor 820 is reflected toward and emitted from the substrate 400. In some embodiments, multiple different phosphors 820 are disposed in one or more of the openings above the semiconductor die 300. That is, one well 810 may have more than one type of phosphor 820 and/or clear material 830. Different wells 810 may, for example, have different phosphors 820 and/or different clear materials 830. In one embodiment, different semiconductor die 300 (e.g., emitting at different wavelengths) may be associated with the same or different phosphors 820 and/or clear materials 830.

In some embodiments, the sidewalls of the openings 810 are not substantially perpendicular to the surface of substrate 400 (as shown in FIG. 8C), but are sloped or otherwise shaped and/or patterned to facilitate the out-coupling of light from the semiconductor die 300 and/or out-coupling of light from phosphor 820. The sidewalls of the openings 810 may even be reflective to light emitted by semiconductor die 300 or the light from phosphor 820 (e.g., coated with a reflective material). An optical element such as a lens or diffuser may be positioned above the semiconductor die 300 and/or the phosphor 820. Well 810 may have any shape appropriate to the application, e.g., round, rectangular, hexagonal shape or any arbitrary shape. Different wells 810 may, in fact, have different shapes.

The phosphor 820 may include or consist essentially of, e.g., one or more silicates, nitrides, quantum dots, or other light-conversion materials, and may be suspended in an optically transparent binder (e.g., silicone or epoxy). Semiconductor dies 300 for use with one or more phosphors 820 may emit substantially blue or ultraviolet light, and the use of the phosphor(s) 820 may result in aggregate light that is substantially white, and which may have a correlated color temperature (CCT) ranging from approximately 2000 K to approximately 7000 K. Examples of such die include those comprising GaN, InN, AlN and various alloys of these binary compounds.

Figure 9A:
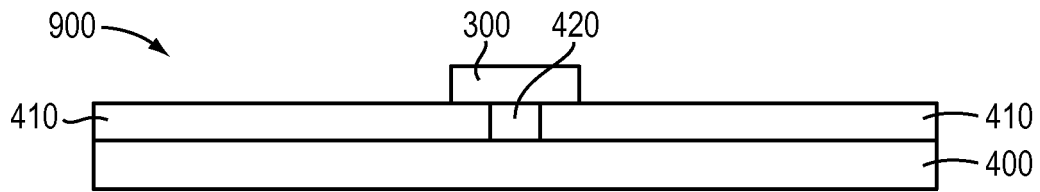
FIGS. 9A-9D are schematic cross-sections of the integration of phosphor with semiconductor dies adhered to a substrate in accordance with various other embodiments of the invention.
Figure 9B:
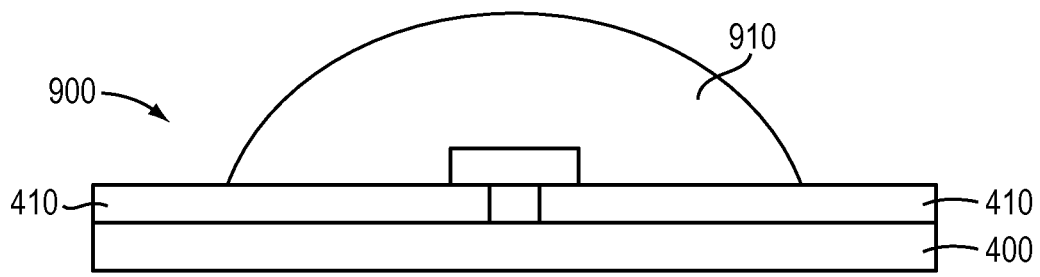

FIGS. 9A-9D illustrates another embodiment of the invention featuring a remote phosphor for wavelength conversion of at least a portion of the light emitted from a semiconductor die 300. FIG. 9A depicts a portion of an electronic device 900 similar to electronic device 600 including a semiconductor die 300 adhered to a substrate 400 across a gap 420 between two conductive traces 410 (flexure and/or deformation of substrate 400, any non-planarity of the semiconductor die 300, and the adhesive 510 have been omitted from the figures for clarity). As shown in FIG. 9B, an optically transparent material 910, which may be designed to provide good optical coupling with the index of refraction of semiconductor die 300, is formed on semiconductor die 300. In some embodiments, the index of refraction of transparent material 910 is between about 1.0 and about 1.65 (e.g., ranging from 1.4 to 1.57). While transparent material 910 is illustrated as having a hemispherical shape, this is not necessary to the present invention and transparent material 910 may have virtually any shape. In some embodiments, transparent material 910 is patterned with a surface profile or texture in order to increase the surface area of phosphor 920 and/or reflective layer 930.

Figure 9C:
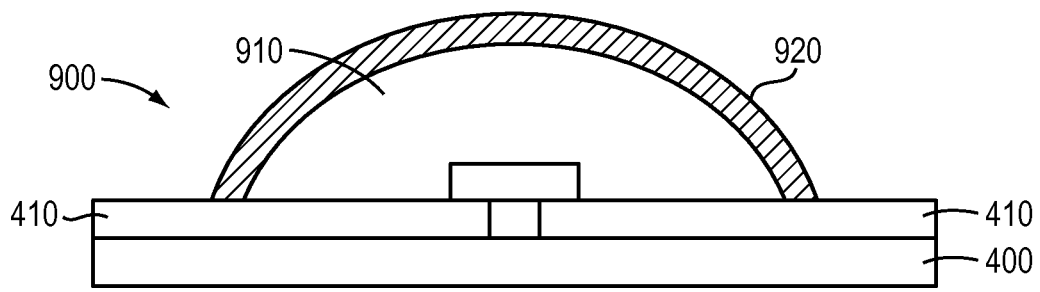
Figure 9D:
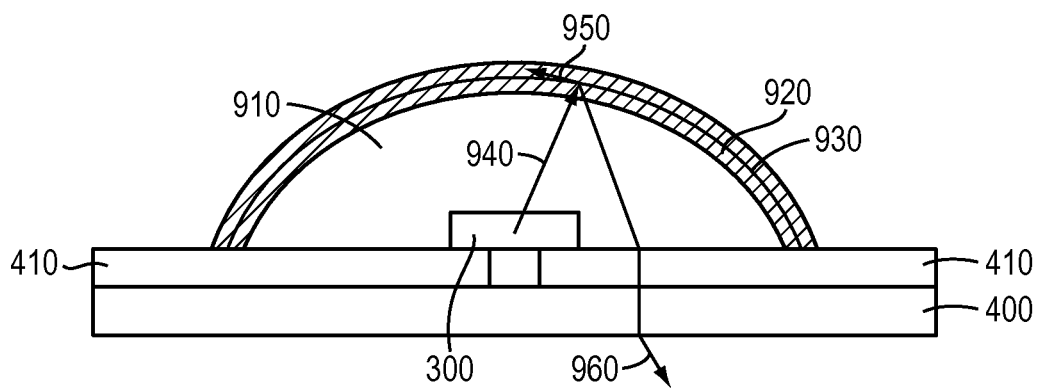

A phosphor 920 (or multiple layers of different phosphors) is formed over the material 910, as shown in FIG. 9C. Phosphor 920 may be any one or more of the materials described above with reference to phosphor 820, and material 910 physically separates phosphor 920 from the semiconductor die 300. While various embodiments of the invention utilize the structure of FIG. 9C to enable emission of color-mixed or converted light through phosphor 920 into the surrounding ambient, FIG. 9D depicts a preferred embodiment in which a reflective layer 930 is formed over the phosphor 920. In the embodiment of FIG. 9D, the converted or color-mixed light reflects from reflective layer 930 after interacting with phosphor 920 and is emitted from device 900 through substrate 400. Reflective layer may be, for example, a highly specular or diffuse reflector. In one embodiment reflective layer 930 is a metal, e.g., aluminum, silver, gold or the like. Reflective layer 930 may be a white reflector, e.g., MCPET. Various phosphor deposition techniques may be employed, including those described in Donofrio, R. L., "Phosphor Screening," *SID Sixth International Conference on Advanced Displays* (1997), pp. 89-95, the disclosure of which is hereby incorporated by reference. In a preferred embodiment, highly reflective layer 360 comprises an electrically conductive material such that electrophoretic deposition may be employed to apply a conformal coating of phosphor 920 with uniform thickness.

In one embodiment, die 300 emits blue light 940 (FIG. 9D). In operation, blue light 940 emitted by LED 300 intersects with phosphor layer 920. Some of the light is absorbed by phosphor particles in phosphor layers 920, whereupon it is re-emitted at a different wavelength. The remainder of the blue light 390 is specularly reflected from the highly reflective surface 930. Some of this blue light is again absorbed by phosphor particles in phosphor layer 920 and re-emitted. The re-emitted light from the phosphor is emitted isotropically by the phosphor particles. Half of the light will be specularly reflected from the highly reflective surface 930, such that substantially all of the light will be emitted into transparent material 910. Depending on the angle of the emitted light, it will either intersect the exterior surface of phosphor layer 930 (shown as ray 950) or exit the cavity via transparent substrate 400 (shown as ray 960).

Figure 10:
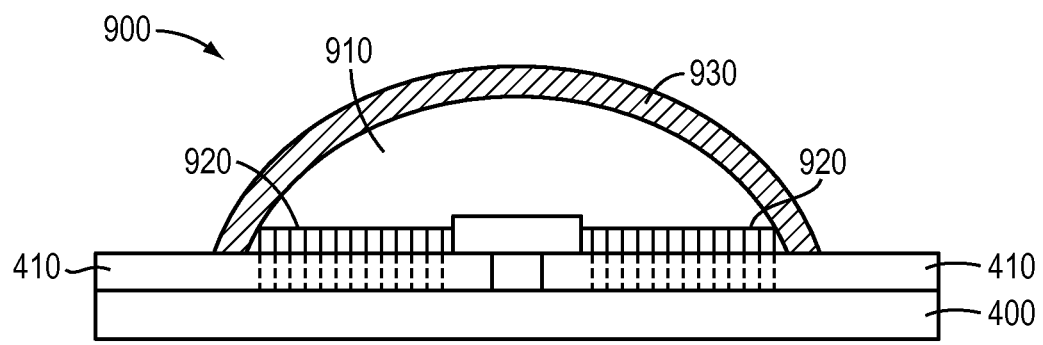
FIG. 10 is a schematic cross-section of an electronic device featuring a semiconductor die and a remote phosphor in accordance with various embodiments of the invention.

FIG. 10 depicts another embodiment of device 900 in which the phosphor 920 is formed directly on substrate 400 (the dashed portions of phosphor 920 represent the portions disposed in front of and/or behind the traces 410) rather than over material 910. In the embodiment of FIG. 10, light emitted from semiconductor die 300 is reflected by reflective layer 930 back toward substrate 400, and at least a portion of the light interacts with phosphor 920 such that the aggregate light emitted from substrate 400 is the desired wavelength or mix of wavelengths (e.g., white light). In the embodiments of FIGS. 9D and 10, traces 410 may be relatively narrow or substantially transparent in order to prevent undesired blocking or back-reflection of light. For examples, transparent traces 410 may include or consist essentially of indium tin oxide, indium zinc oxide, aluminum zinc oxide, carbon nanotubes, graphene, and/or conductive polymers such as poly(3, 4-ethylenedioxythiophene doped with poly(styrene sulfonate).

Figure 11:
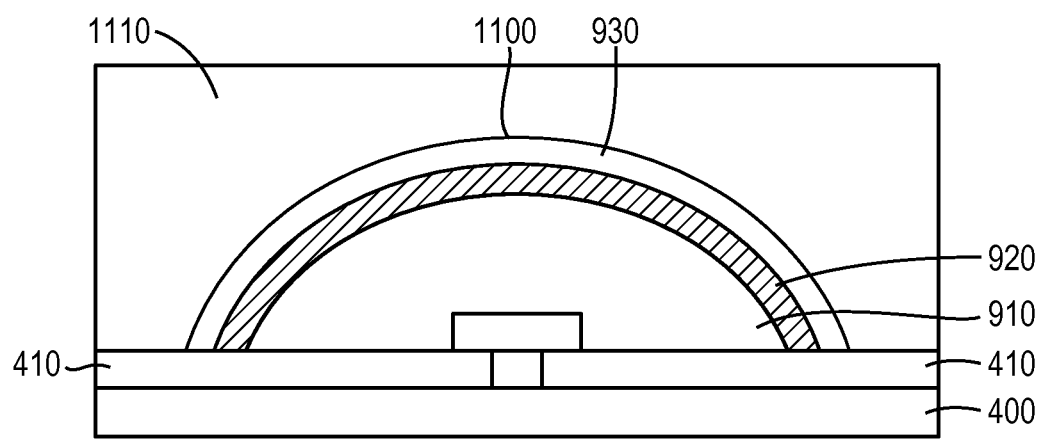
FIG. 11 is a schematic cross-section of an electronic device featuring a semiconductor die and a second substrate incorporating a remote phosphor in accordance with various embodiments of the invention.

As shown in FIG. 11, the material 910, phosphor 920, and reflective layer 930 may be formed within a depression, cavity, or other opening 1100 in a substrate 1110, which is then bonded to substrate 400 such that these layers are disposed over semiconductor die 300 similarly to the embodiment of FIG. 9D. In such embodiments, material 910 may even be omitted (i.e., may be air or vacuum). Although not explicitly depicted, reflective layer 930 may be formed in the depression of substrate 1110 and phosphor 920 may be formed proximate semiconductor die 300 on substrate 400 in order to form a structure resembling that of FIG. 10. Substrate 1110 may be yielding or substantially rigid, and may even be optically translucent or opaque, as light from the semiconductor die 300 is emitted through substrate 400. Cavity 1100 is preferably substantially hemispherical in shape, but may also take other shapes, e.g., ellipsoidal, paraboloidal, hyperboloidal, or pyramidal (with three or more substantially planar sides). In some embodiments, cavity 1100 is patterned with a surface profile or texture in order to increase the surface area of phosphor 920 and/or reflective layer 930. In one embodiment, the surface of substrate 400 facing transparent material 910 is treated with an antireflection coating to minimize reflections from said surface.

Embodiments of the present invention offer numerous advantages, including, without limitation, the following. First, the transparent material 910, e.g., air, epoxy or silicone, thermally insulates the phosphor layers 370 and 380 from the LED die, alleviating the risk of thermal quenching. Second, dichroic mirrors are not required, greatly improving manufacturability and reducing cost. Instead, the mirrored surface 360 reflects any light emitted by the phosphor particles incident on it back through phosphor layer 920 to transparent substrate 400. Third, the hemispherical shape of the remote phosphor shell doubles the surface area of the phosphor layer 920 exposed to the blue light emitted by the LED die 300. This effectively doubles the luminous exitance of the circular opening in substrate 400 defined by transparent material 910. (In other words, it effectively doubles the photometric brightness of the opening as viewed from all angles through transparent substrate 400, due to the increased phosphor layer surface area.)

Fourth, it has been shown (see, e.g., Yamada, K., Y. Imai, and K. Ishi, "Optical Simulation of Light Source Devices Composed of Blue LEDs and YAG Phosphor," *Journal of Light & Visual Environment* 27(2):70-74 (2003) (hereafter "Yamada et al.")) that YAG:Ce phosphor saturates at a concentration of approximately 20% by weight in transmission mode, but saturates at a concentration of 50% to 60% by weight in reflection mode. The phosphor layer 920 may therefore have a higher concentration and so provide increased conversion efficiency. As demonstrated by Yamada et al., increased conversion efficiencies of 50% are possible with YAG:Ce phosphor materials. Fifth, it has also been shown (see, e.g., Yamada et al.) that the chromaticity of light generated by blue InGaN LEDs and YAG:Ce phosphor exhibits considerably less variation with phosphor concentration in reflection mode versus transmission mode. Hence, the present invention may provide relaxed manufacturing tolerances for the thickness and uniformity of the phosphor layer 920.

Sixth, the mirrored surface 930 reflects incident light regardless of its angle of incidence and regardless of whether it is scattered blue light from the LED die 300 or emitted light from the phosphor layer 920. Seventh, the radiation emitted from the phosphor layer surface has a Lambertian distribution. This includes both the reflected blue light and the phosphor-emitted light. In accordance with radiative flux transfer theory and view factor geometry, exactly one half of this light will be incident upon substrate 400, while the other half will be incident on the phosphor layer. Depending on its wavelength, this light may further excite the phosphor particles, thereby providing a form of positive optical feedback that further improves the down-conversion efficiency of the phosphors. (For example, the excitation and emission spectra of YAG:Ce overlap in the region of approximately 475 nm to 525 nm, so that emitted light within this region self-excites the phosphor rather than being absorbed.)

The shape of the transparent material 910 is nominally a hemisphere. If it is shallower, the surface area of the phosphor layer is reduced, which tends to reduce the luminous exitance of the circular opening in substrate 400 defined by the transparent material 910. However, the light from the LED die 300 will not be at normal incidence to the phosphor surface at the periphery of the cavity. This will tend to increase specular reflections from the phosphor layer in accordance with the Fresnel equations, which may enhance the luminous exitance of the circular opening. If transparent material 910 is deeper, more than one half of the light will undergo multiple reflections within the cavity, which will tend to reduce the luminous exitance. However, this may be offset by self-excitation of the phosphor layers. In practice, then, a deeper or shallower shape than a hemispherical shape for transparent material 910 may be optimal, depending on the bidirectional reflectance distribution function (BRDF) of the exposed phosphor layer surface and the optical gain provided by self-excitation of the phosphor from its own emission. The optimal cavity shape may therefore be ellipsoidal, paraboloidal, or hyperboloidal. It may also be pyramidal, with three or more planar sides.

The reflection (on average) of one-half of the light emitted by the phosphor particles by the mirrored surface 930 and scattered by phosphor layer 920 will tend to homogenize the light emitted from the circular opening in substrate 400 defined by the transparent material 910. This will, as a consequence, improve both intensity and color uniformity, further relaxing the manufacturing tolerances for the phosphor layer thickness and phosphor particle density.

Figure 12A:
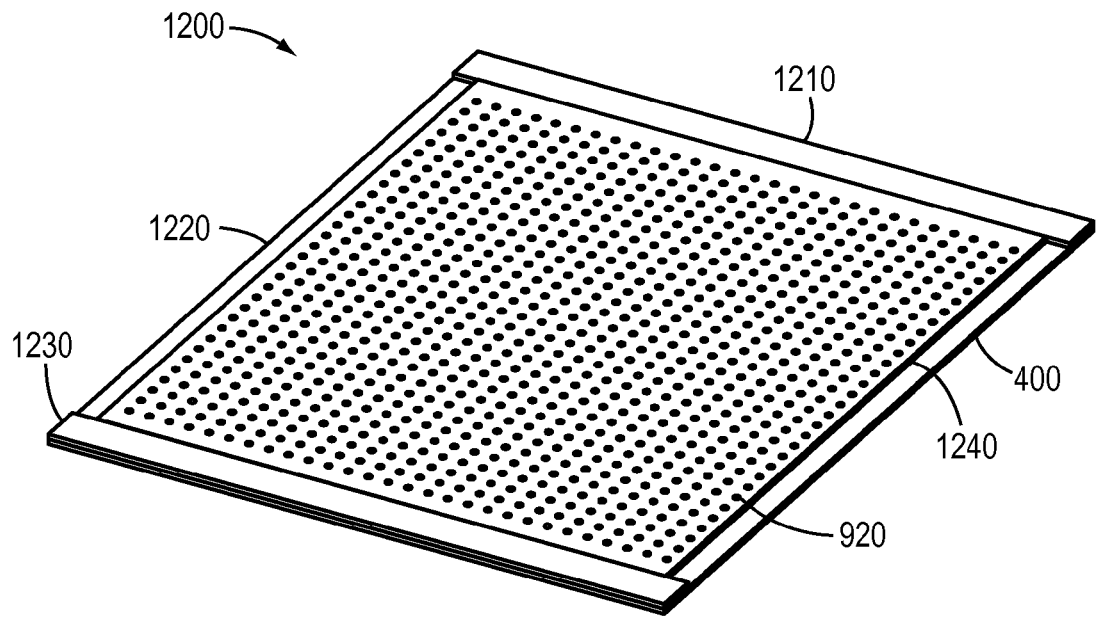
FIG. 12A is an isometric view of an electronic module incorporating light-emitting semiconductor dies in accordance with various embodiments of the invention.

FIG. 12A shows an example of an electronic module 1200 (e.g., a lighting module) according to various embodiments of the present invention. The module 1200 may have a generally planar shape with a relatively thin profile. In its initial, or rest state, module 1200 may be flat, curved in one direction, curved in two directions, or it may have a more complex curvature. The module 1200 may feature a substantially yielding substrate 400 having an array of semiconductor dies 300 thereon (not shown in this figure). Semiconductor die 300 may be organized in a regular or random array on substrate 400. In the embodiment where semiconductor die 300 comprises a LED, the LED pitch (that is, the spacing between LEDs in the array) in the array may vary from about 2 mm to about 25 mm. In one embodiment, the LED pitch is determined by dividing the required total amount of light from LEDs for module 1200 by the light emitted by one LED. It will be clear to one skilled in the art that the LED pitch is a function of the amount of light emitted by one LED. For example, the same amount of total light may be produced using relatively more LEDs emitting relatively less light but with a relatively smaller LED pitch as by relatively fewer LEDs emitting relatively more light with a relatively larger LED pitch. In one embodiment, the LED pitch is at least in part determined by the distance between the LED and any associated optics or diffusers (incorporated, for example, in plate 1240 or otherwise). In one embodiment, the LED pitch is similar to or substantially the same as the distance between the LED and an associated diffuser.

One or more circuit boards may be coupled to the substrate 400. As shown, three circuit boards 1210, 1220, 1230 are attached to substrate 400. The circuit boards 1210, 1220, 1230 may have a long, thin rectangular shape in order to be positioned at the edges of the substrate 400. Portions or all of the drive circuitry, for example current-source components, may be disposed on one or more of the circuit boards 1210, 1220, 1230, which may be yielding or substantially rigid. In an embodiment, one or more of the circuit boards 1210, 1220, 1230 includes or consists essentially of a printed circuit board (PCB) attached to the substrate 400 with, for example, a connector, conductive adhesive, anisotropic conductive adhesive or film or conductive epoxy or flexible connector to connect various components to individual semiconductor dies 300. In one embodiment, circuit boards 1210, 1220, 1230 are electrically coupled to substrate 400 with flexible connectors, permitting flexibility in the positioning of circuit boards 1210, 1220, 1230 relative to substrate 400.

Figure 12B:
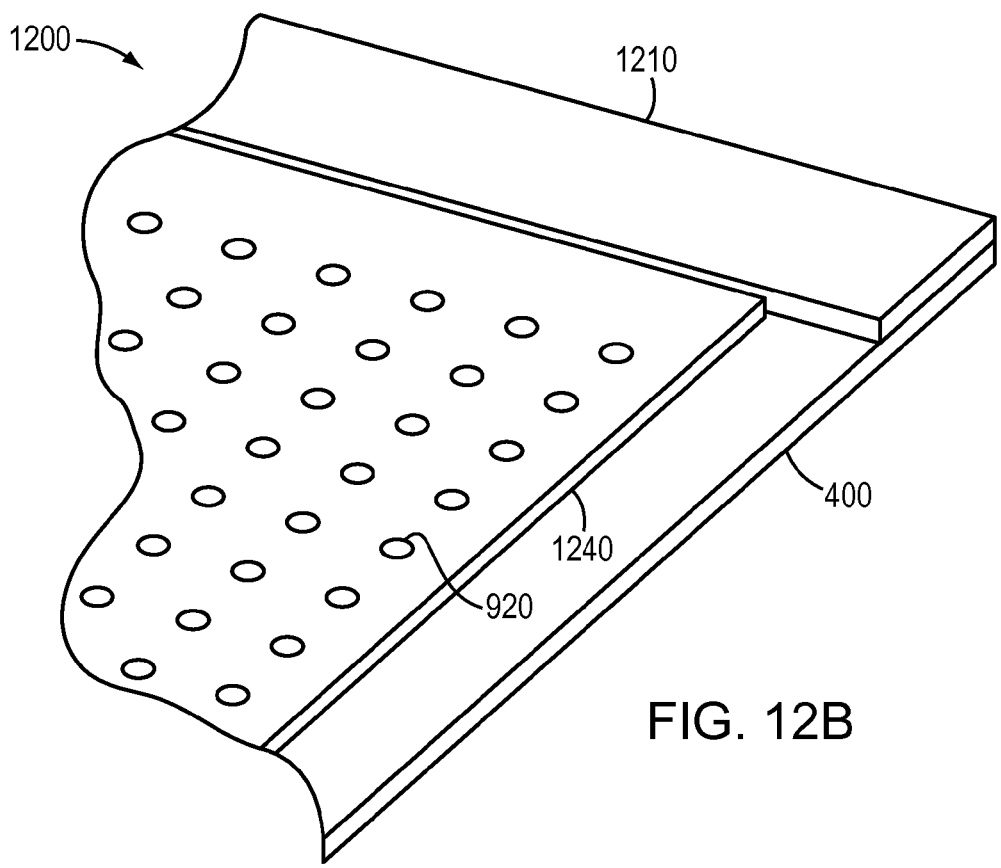
FIG. 12B is a magnified view of a portion of the module depicted in FIG. 12A.
Figure 13:
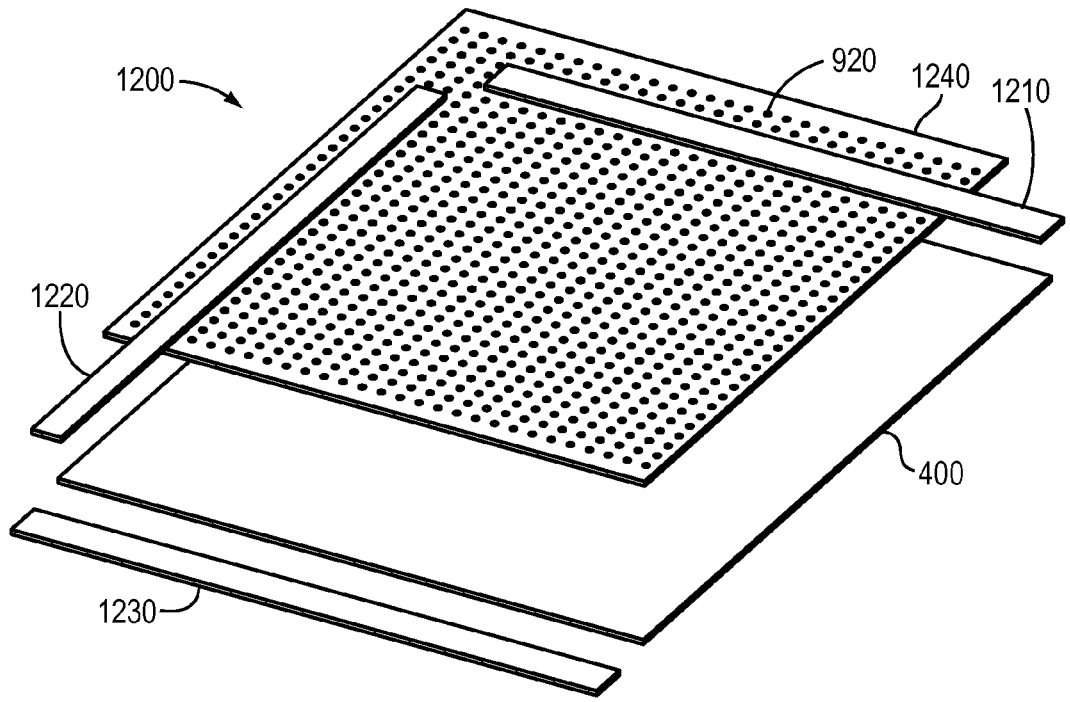
FIG. 13 is an exploded view of portions of the electronic module of FIG. 12A.

Optionally, a transparent plate 1240 may be located on top of the substrate 400. In an embodiment, the plate 1240 is patterned with localized deposits of phosphor 920, as shown in FIG. 12B, which align with light-emitting semiconductor dies 300 such that light emitted by the dies 300 irradiates the various phosphor deposits. In a preferred embodiment, the combination of light from the semiconductor dies 300 and the light emitted from the phosphor 920 produces white light with any of a variety of correlated color temperatures (CCTs). In other embodiments, the phosphors 920 are formed over the semiconductor dies 300 as shown in FIG. 9A-9D, 10, or 11, or may even be formed as a substantially continuous layer on a surface of plate 1240. FIG. 12B is a magnified view of a corner of the module 1200 shown in FIG. 12A. As shown, the circuit board 1210 may act as a location stop for the transparent plate 1240. Likewise, the other circuit boards 1220, 1230 may provide a mechanical location reference for the plate 1240. FIG. 13 depicts an exploded view of the module 1200, showing the substrate 400, the circuit boards 1210, 1220, 1230, and the plate 1240 with deposits of phosphor 920.

Various embodiments of the invention feature different physical configurations. For example, the module 1200 may have one, two, four, or more circuit boards. One or more of the circuit boards may not necessarily extend the full length of an edge of the substrate 400, and or two or more circuit boards may be affixed to the same edge of the substrate 400. The circuit board(s) may not lie flush with the edges of the substrate 400, but rather may overhang one or more edges or may be positioned a distance away from an edge. A blank (i.e., optically transparent, without deposits of phosphor 920) piece of material may be added as an additional locator for the plate 1240. The plate 1240 may include optics such as lenses, waveguides, reflectors, diffractors and/or diffusers.

Figure 14:
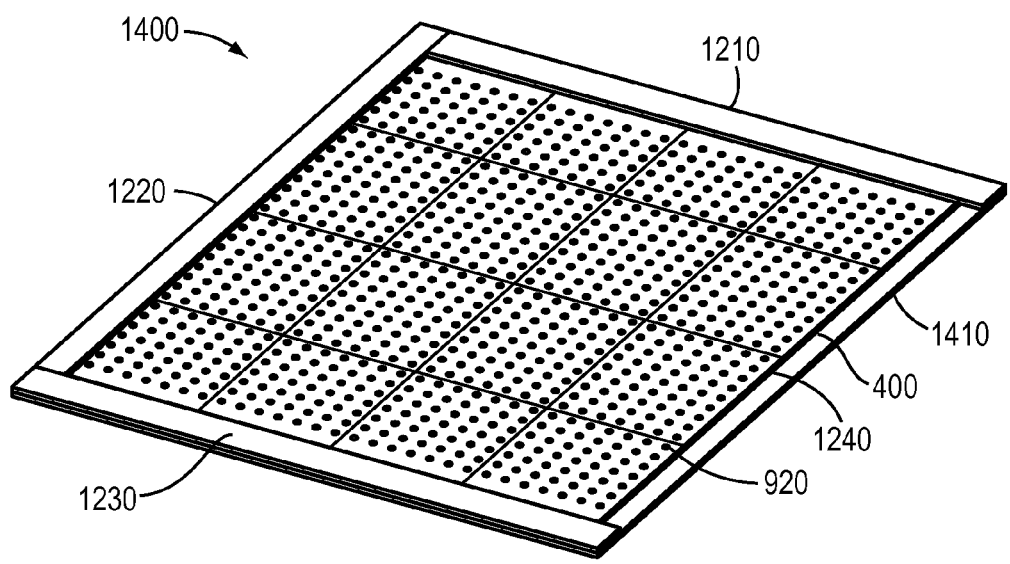
FIG. 14 is an isometric view of an electronic module incorporating multiple substrates each with semiconductor dies adhered thereto, in accordance with various embodiments of the invention.

Electronic modules 1200 may be fabricated by assembling different substrates 400 with wire bonds, soldered jumper wires, flexible connectors, anisotropic conductive films or other means of electrical connection to produce arrays of one or more tiles. An embodiment of such a module 1400 is shown in FIG. 14, which as shown is fabricated from multiple substrates 400. The substrates 400 may be mounted on a planar carrier 1410, and may be bounded on one or more sides by circuit boards, e.g., circuit boards 1210, 1220, 1230. As described above for module 1200, module 1400 may also feature a plate 1240 with areas of phosphor 920 or optical elements aligning with the semiconductor dies 300 on the various substrates 400.

Figure 15:
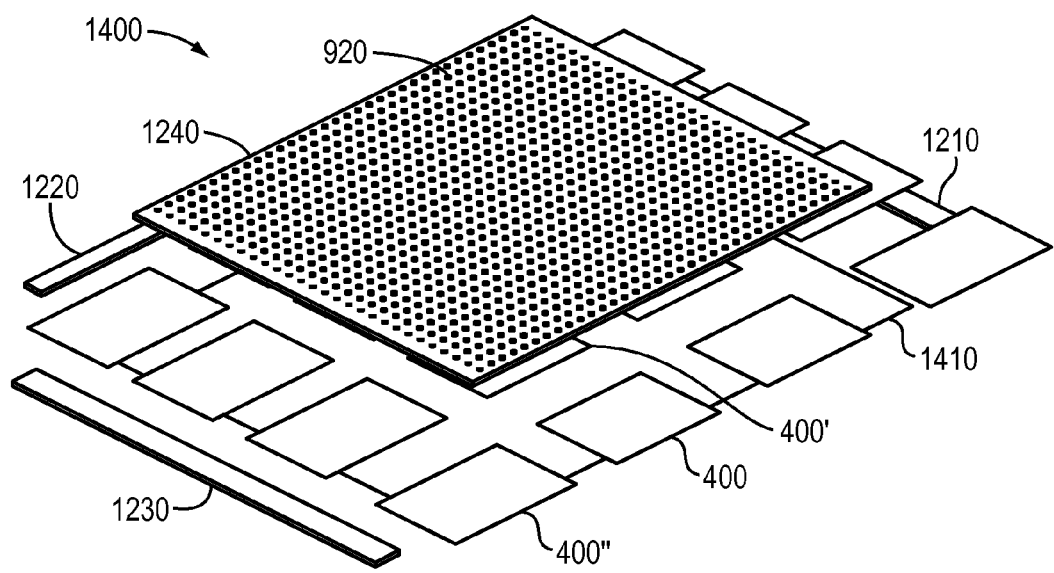
FIG. 15 is an exploded view of portions of the electronic module of FIG. 14.

Any or all of the circuit boards 1210, 1220, 1230 and multiple substrates 400 may be mounted on a single large-area transparent carrier 1410 with or without phosphors and or optical elements to form a thin panel with a substantially constant luminance distribution, suitable for a wide range of uses, for example for general or architectural lighting applications or as a backlight unit for LCD display panels. FIG. 15 shows an exploded view of such an electronic module 1400, showing the multiple substrates 400, circuit boards 1210, 1220, 1230, and the plate 1240 with regions of phosphor 920 and or optical elements. In some embodiments, any or all of the various substrates 400 in module 1400 may be different from each other, e.g., support different numbers and/or types of semiconductor dies 300, phosphors and/or optical elements. For example, a different substrate 400' may be used for the interior positions and yet another different substrate 400" may be used for the corner positions. The individual substrates 400 may be square, rectangular, hexagonal, triangular. L-shaped, or any other tessellating or non-tessellating shape. In some embodiments, phosphor 920 is the same type of phosphor at all locations, while in other embodiments different phosphors may be used at different locations. Phosphor 920 may be integrated in ways other than on plate 1240, for example, as shown in FIGS. 8-11. The shapes of modules 1200 are not critical, and these modules may be, for example, rectangular, square, hexagonal or any other shape to meet design, architectural or lighting needs.

Figure 16A:
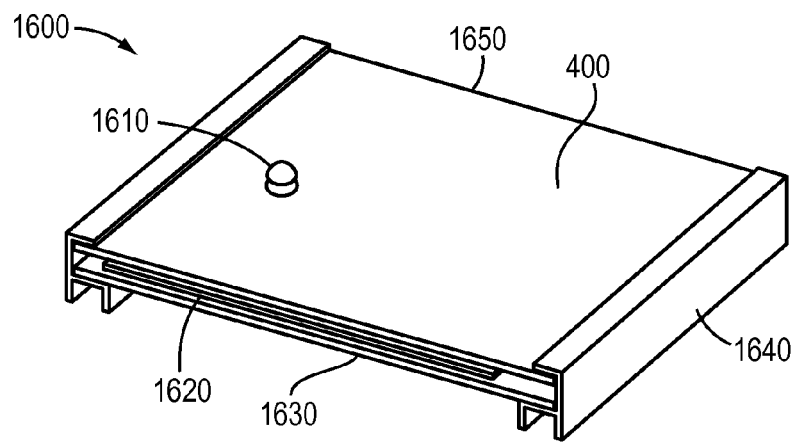
FIG. 16A is an isometric view of an electronic module incorporating light-emitting semiconductor dies and a sensor in accordance with various embodiments of the invention.

FIG. 16A depicts an electronic module 1600 that includes a sensor 1610 for detecting such features as room occupancy, ambient light, or other environmental factors known to those skilled in the art. One or more such sensors 1610 may be included in the module 1600, and thus module 1600 may detect more than one environmental factor. Feedback (i.e., signals) from the sensor 1610 may be used to operate the module 1600, e.g., operating one or more semiconductor dies 300. For example, light-emitting semiconductor dies 300 may be turned on or off or operated so as to dim the light emitting therefrom (either immediately or after a time delay). A drive circuit 1620 may be mounted within module 1600 and may include a feedback system to enable the data from the sensor 1610 to operate the module 1600. Drive circuit 1620 may include or consist essentially of a dimming circuit. The module 1600 may also include a support 1630 (including or consisting essentially of, e.g., plexiglass or another substantially rigid material), a support frame 1640, and a substrate 400 having one or more semiconductor dies 300 adhered thereto. A cover plate 1650 (including or consisting essentially of, e.g., plexiglass or another substantially transparent or translucent material) may also include additional optics.

In various embodiments, a light sensor 1610 may be incorporated into each of multiple modules 1600 functioning as a luminaire, such that the light sensor 1610 samples the ambient that is substantially illuminated by that luminaire. If the light intensity is larger than a certain threshold level, the module(s) 1600 in the luminaire are dimmed to a point where the sensed light intensity (i.e., the aggregate light intensity from other sources in the ambient, e.g., sunlight, and the module 1600 itself) is at the threshold value. In this manner, a new or retrofit unit incorporating one or more modules 1600 may provide substantial energy savings through daylight harvesting, without the need to install an expensive central lighting control system. This is a particular advantage when installing retrofit units, as it obviates the need to install wiring required for a central control system in an existing building or other installation.

In another embodiment, an occupancy sensor 1610 is incorporated into one or more modules 1600 functioning as a luminaire. In a similar manner as discussed above, the occupancy sensor 1610 may sample the area illuminated by the luminaire, and if no occupant is present, dim or turn off the luminaire. This may result in energy savings without a "pillar of light" situation, where only one light is on over an occupied area. Such modules 1600 may also incorporate a low-level communication system for communication between modules. The communication system may enable synchronization of nearby luminaires to provide improved light quality while conserving energy. Such operation may also be synchronized with daylight harvesting. Different communication techniques may be used for this, but various embodiments may use wired, wireless or optical communication, where one or more light-emitting semiconductor dies 300 are modulated at a high frequency to provide the communication signal.

In some embodiments of the invention, the above-described control circuits preferably include modulation/demodulation circuitry, and may even include circuitry such as a microprocessor, microcontroller, or the like to process the transmitted and/or received communications. The signals may, for example, represent commands that adjust the operation of a master lighting system incorporating the modules 1600. Suitable network and communication circuitry are well characterized in the art and a networked system of intercommunicating such lighting systems can be straightforwardly configured without undue experimentation.

Figure 16B:
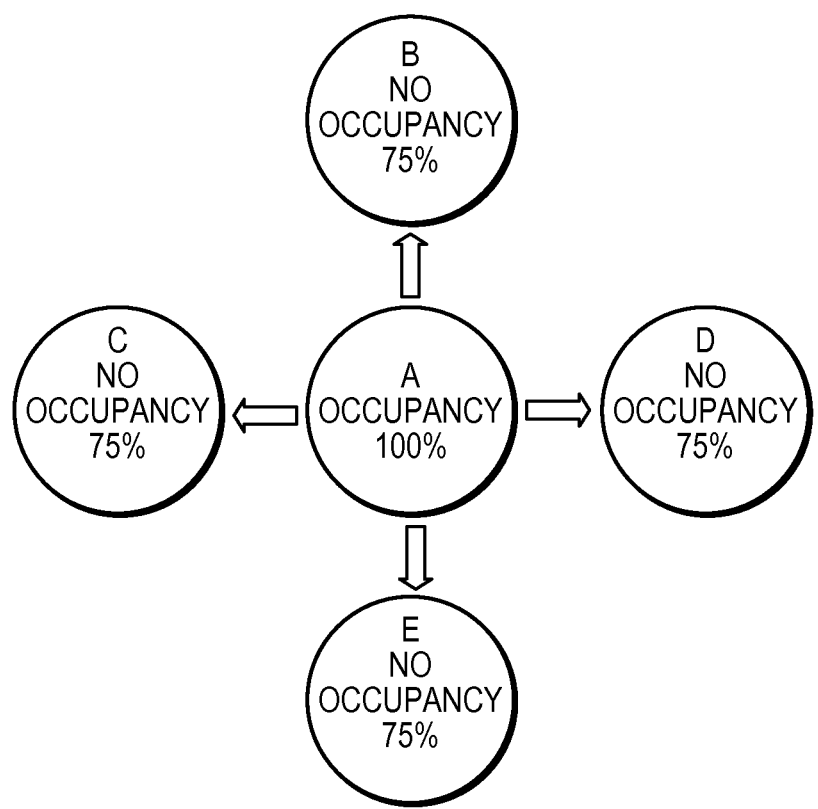
FIG. 16B is a schematic view of a network of electronic modules like that depicted in FIG. 16A.

In various embodiments, each module 1600 may sense the state of its nearest-neighbor modules 1600 (or other light-emitting fixtures) and take some action based on what is sensed. For example, as depicted in FIG. 16B, a module A may sense a person in its local area. The surrounding modules B, C, D and E may not sense a person in their local areas, but do sense that A is emitting light. The control system may be programmed such that, for this situation, the desired light level in the areas illuminated by modules B. C, D, and E is 75% (compared to the light level emitted by module A). The next-nearest-neighbors (not shown) may also not sense occupancy in their local areas, but sense that their neighbors are emitting at 75%, and may thus emit at a value of, e.g., 50% of the nominal level. Extension of this scheme to multiple levels of neighboring modules results in an autonomous system that detects occupancy and self-adjusts across modules to provide light around an occupant but to turn off unneeded lights to save energy in a manner comfortable for the occupant. Again, programmable control circuitry and suitable sensors are conventional in the art, and may be programmed to achieve desired sensor-responsive illumination conditions (e.g., light drop-off patterns based on sensed occupancy) without undue experimentation.

Figure 17:
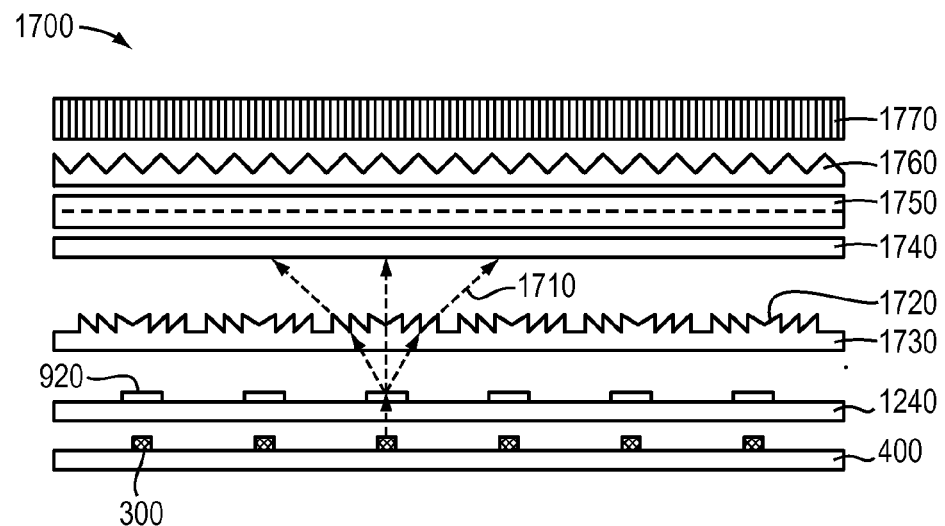
FIGS. 17, 18A and 18B are partially exploded cross-sections of electronic modules for backlighting applications in accordance with various embodiments of the invention.

In the embodiment shown in FIG. 17, an electronic module 1700 (similar to module 1500 and/or 1600) operates as a backlighting unit (BLU) assembly for, e.g., a liquid crystal display (LCD) assembly. The lighting module 1700 includes an array of light-emitting semiconductor dies 300 (e.g., LEDs and/or lasers) adhered to a substrate 400 that irradiate areas of phosphor 920 on a substrate 1240 (which is preferably optically transparent). (Flexure and/or deformation of substrate 400, any non-planarity of the semiconductor dies 300, traces 410 and the adhesive 510 have been omitted from various figures for clarity.) The combined light 1710 (including or consisting essentially of unconverted light emitted by semiconductor die 300 and/or light converted to a different wavelength by phosphor 920) is directed through one or more optical elements 1720 (e.g., Fresnel lenses) that may be embossed or molded on a substrate 1730 (which is preferably optically transparent). The light 1710 then preferably illuminates an optical diffuser 1740. The diffused light is then preferably directed through crossed brightness enhancement films 1750, 1760 (e.g., Vikuiti BEF manufactured by 3M Corporation), which partially collimate and further diffuse the light that illuminates an LCD assembly 1770. In another embodiment, semiconductor die and phosphor 920 are integrated as shown in FIGS. 8-11.

Figure 18A:
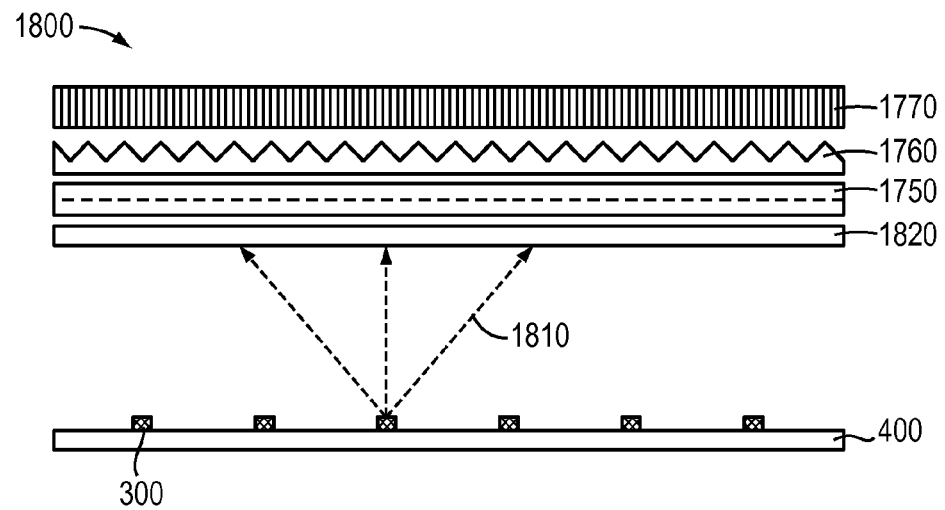

FIG. 18A depicts an electronic module 1800 that also operates as a BLU assembly for, e.g., an LCD assembly. The lighting module 1800 includes an array of light-emitting semiconductor dies 300 (e.g., LEDs and/or lasers) adhered to a substrate 400, light 1810 from which irradiates a substrate 1820 that uniformly includes or consists essentially of a phosphor material (such as phosphor 920). Similarly to module 1700, the combined and/or converted light is then directed through crossed brightness enhancement films 1750, 1760, which partially collimate and further diffuse the light that illuminates LCD assembly 1770.

Figure 18B:
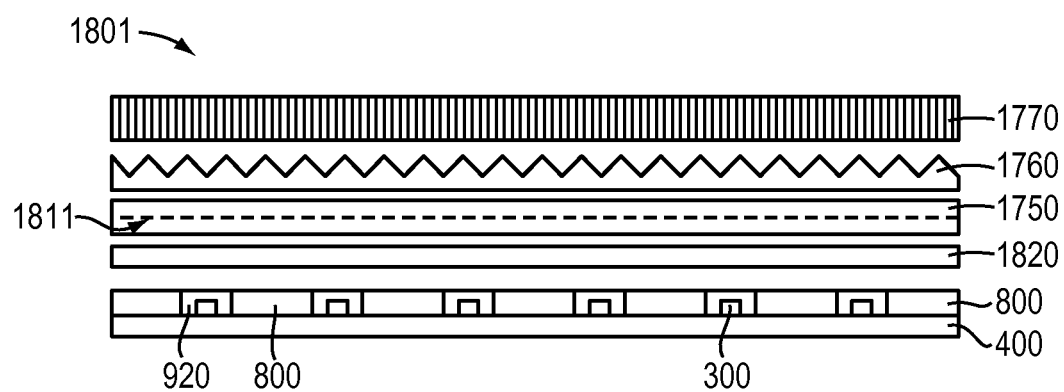

FIG. 18B depicts an electronic module 1801 that also operates as a BLU assembly for, e.g., an LCD assembly. The lighting module 1801 includes an array of light-emitting semiconductor dies 300 (e.g., LEDs and/or lasers) adhered to a substrate 400, a second substrate 800 with wells 810 (see FIG. 8A) positioned over substrate 400 such that semiconductor die 300 are within wells 810, which are completely or partially filled with phosphor 920. Light 1811 comprising light from semiconductor die 300 and phosphor 920 is directed through crossed brightness enhancement films 1750, 1760, which partially collimate and further diffuse the light that illuminates LCD assembly 1770.

Figure 19:
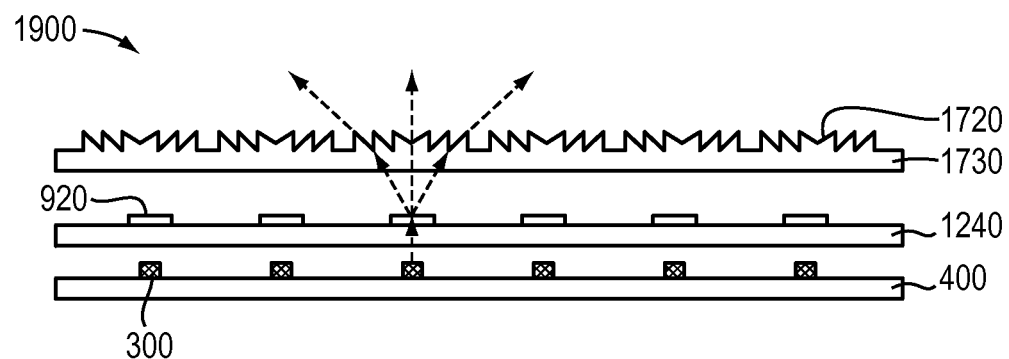
FIGS. 19 and 20 are partially exploded cross-sections of electronic modules for general illumination in accordance with various embodiments of the invention.
Figure 20:
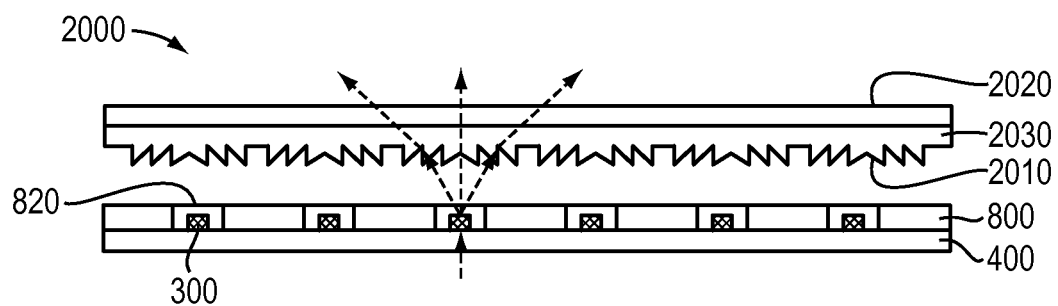

FIGS. 19 and 20 depict electronic modules similar to modules 1700, 1800 and 1801 that function as planar light sources for general illumination. As shown in FIG. 19, an electronic module 1900 includes an array of light-emitting semiconductor dies 300 (e.g., LEDs and/or lasers) adhered to a substrate 400 that irradiate areas of phosphor 920 on a substrate 1240 (which is preferably optically transparent). The combined light (including or consisting essentially of unconverted light emitted by semiconductor die 300 and/or light converted to a different wavelength by phosphor 920) is directed through one or more optical elements 1720 (e.g., Fresnel lenses) that may be embossed or molded on a substrate 1730 (which is preferably optically transparent). In another embodiment, semiconductor die and phosphor 920 are integrated as shown in FIGS. 8-11.

Similarly, FIG. 20 depicts an electronic module 2000 that also includes an array of light-emitting semiconductor dies 300 (e.g., LEDs and/or lasers) adhered to a substrate 400. In module 2000, one or more of the semiconductor dies 300 are "encapsulated" in phosphor 820 in the manner described above with reference to FIGS. 8A-8D. The combined light (including or consisting essentially of unconverted light emitted by semiconductor die 300 and/or light converted to a different wavelength by phosphor 820) may be directed through any of a variety of optics, e.g., the asymmetric Fresnel lenses 2010 and/or holographic diffuser 2020 depicted in FIG. 20. The optics may be portions of, formed on, and/or bonded to a transparent substrate 2030. The lenses 2010 may be positioned at a desired distance away from the semiconductor dies 300 such that the image of each semiconductor die 300 substantially uniformly fills the exit pupil of its associated lens 2010 when viewed on-axis. All or a portion of light emitting die 300 may be associated with optical elements, for example, lenses. In one embodiment an array of light emitting die 300 is associated on a one-to-one basis with an array of optical elements.

Figure 21:
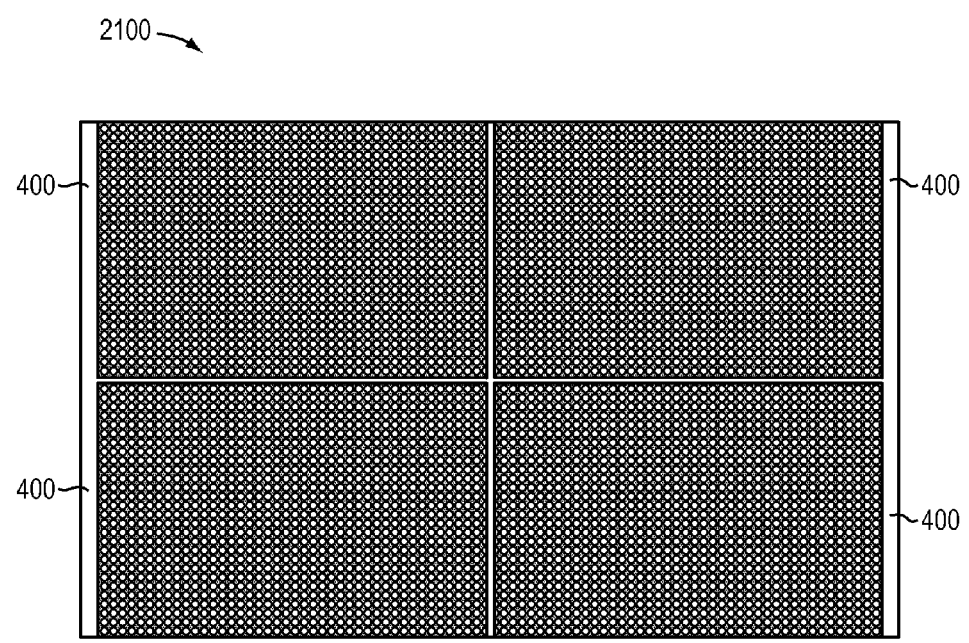
FIG. 21 is a bottom view of an electronic module incorporating multiple substrates with semiconductor dies adhered thereto, in accordance with various embodiments of the invention.
Figure 22A:
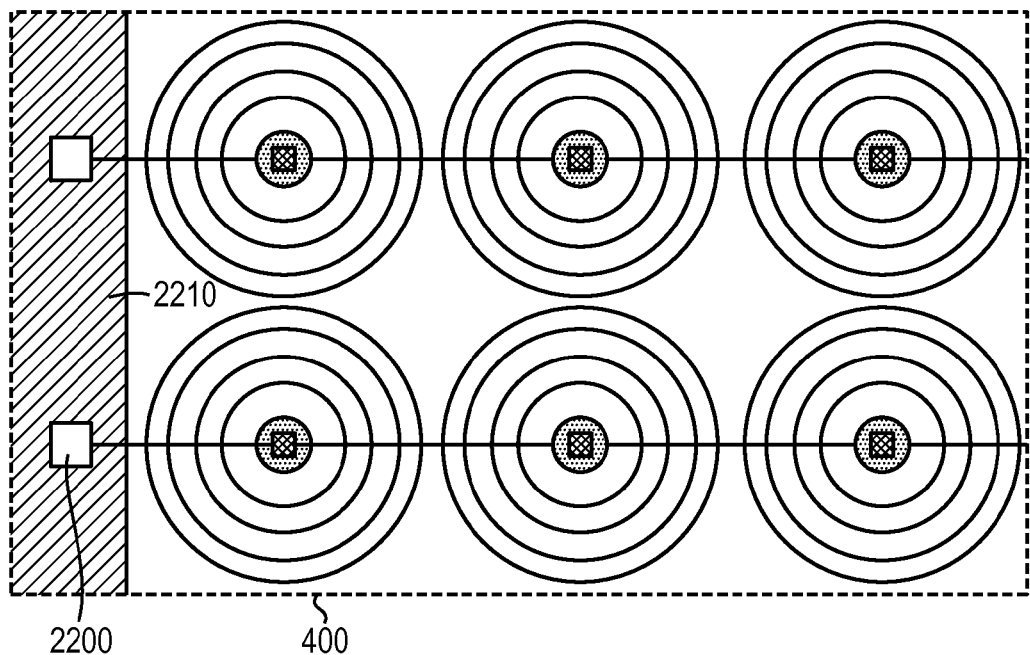
FIGS. 22A and 22B are, respectively, a bottom view and a schematic cross-section of portions of the module of FIG. 21.
Figure 22B:
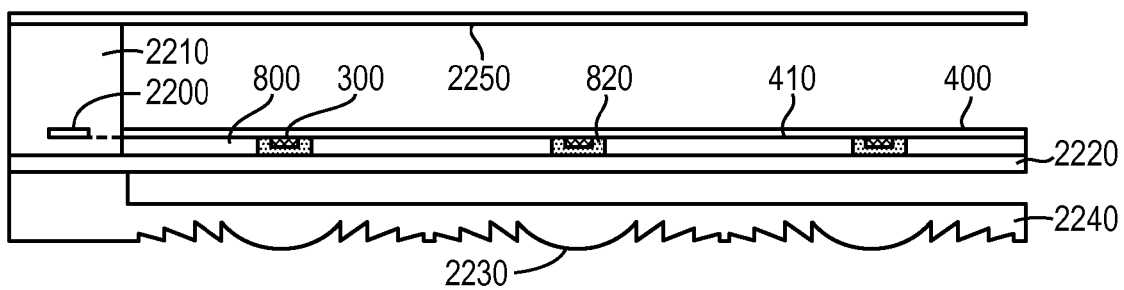

Referring to FIGS. 21, 22A, and 22B, in various embodiments, multiple substrates 400, each having one or more light-emitting semiconductor dies 300 adhered thereto, are assembled together to form a module 2100 that is a drop-in replacement for commercial lighting products. Each substrate 400 and its associated semiconductor dies 300 may be assembled independently of the other modules. The substrates 400 may be sorted (or "binned") such that they possess similar or complementary characteristics, such as correlated color temperature, light output, and electrical properties such as forward voltage.

As shown in FIGS. 22A and 22B, each substrate 400 features one or more light-emitting semiconductor dies 300 (e.g., LEDs and/or lasers), and may also be bonded to a substrate 800 containing regions of phosphor 820 in the manner depicted in FIG. 8A-8D, 9A-9D, 10, or 11. The electrical traces 410 may terminate in connection pads 2200 to facilitate electrical connection of the semiconductor dies 300 to driving circuitry 2210. The electrical connections for each string of semiconductor dies 300 are preferably on one side of the substrate 400 (e.g., in the manner depicted in FIG. 7B) in order to separate the light-emission area of module 2100 from drive circuitry 2210 and/or other electronic components.

Figure 23:
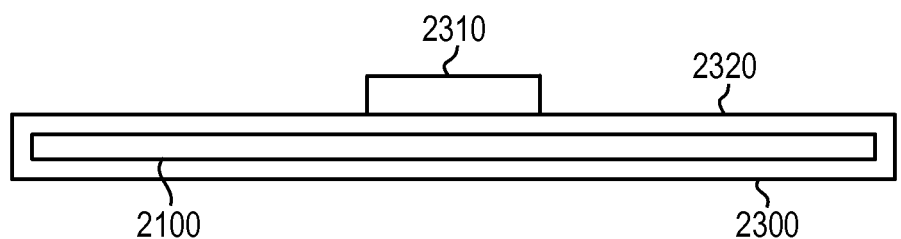
FIG. 23 is a schematic cross-section of the module of FIG. 21 inserted into a mechanical support frame.

As shown in FIGS. 21-23, several substrates 400 may be assembled together to form a larger light-emitting module 2100. The substrates 400 may be assembled together on a larger substrate 2220, which may have optical elements (e.g., discrete optics, diffusers, micro optics, and/or other optical elements) contained within and/or bonded or formed thereon. Substrate 2220 is also preferably transparent and may be yielding or substantially rigid. Preferably, the optical elements include or consist essentially of lenses 2230 (such as Fresnel lenses) that are molded into a rigid substrate 2240 (and/or substrate 2220). A reflector 2250 may optionally be disposed on the top of at least a portion of module 2100 to reflect any light that is reflected from, e.g., substrate 2220.

The module 2100 may be mounted into a housing as shown in FIG. 23. The module 2100 may be attached to and/or placed within a rigid frame 2300 (which may include or consist essentially of one or more substantially rigid materials, e.g., metal, plastic) to provide mechanical support. A power supply 2310 for powering the semiconductor dies 300 and any other circuitry (e.g., driving circuitry 2210, control circuitry, interfaces, etc.) may be disposed on a top surface 2320 of frame 2300. Thus mounted, the module 2100 may serve as a retrofit kit for existing luminaires in a building, a replacement luminaire for existing luminaires, or a new luminaire product for new construction. The thin form factor, optionally less than approximately one inch in thickness, enables module 2100 to be used in many different situations. Packaged modules 2100 may have form factors that match existing commercial installations, e.g., one foot by four feet, two feet square (i.e., two feet by two feet), and/or two feet by 4 feet, or may have other shapes and form factors to meet various design or lighting requirements.

Figure 24A:
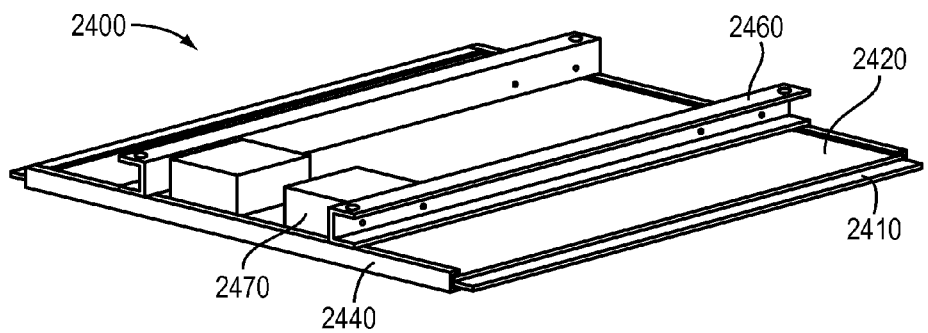
FIGS. 24A and 24B are, respectively, a top isometric view and a bottom isometric view of an electronic module utilized as a retrofit for a luminaire in accordance with various embodiments of the invention.
Figure 24B:
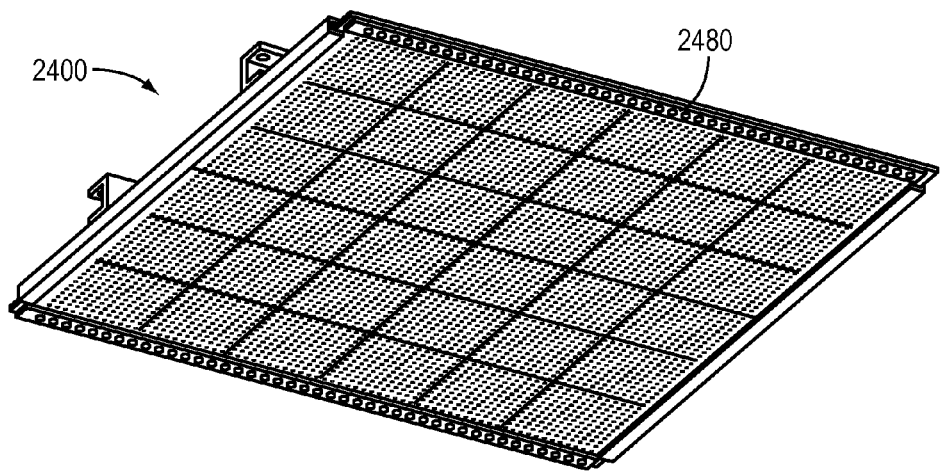
Figure 25:
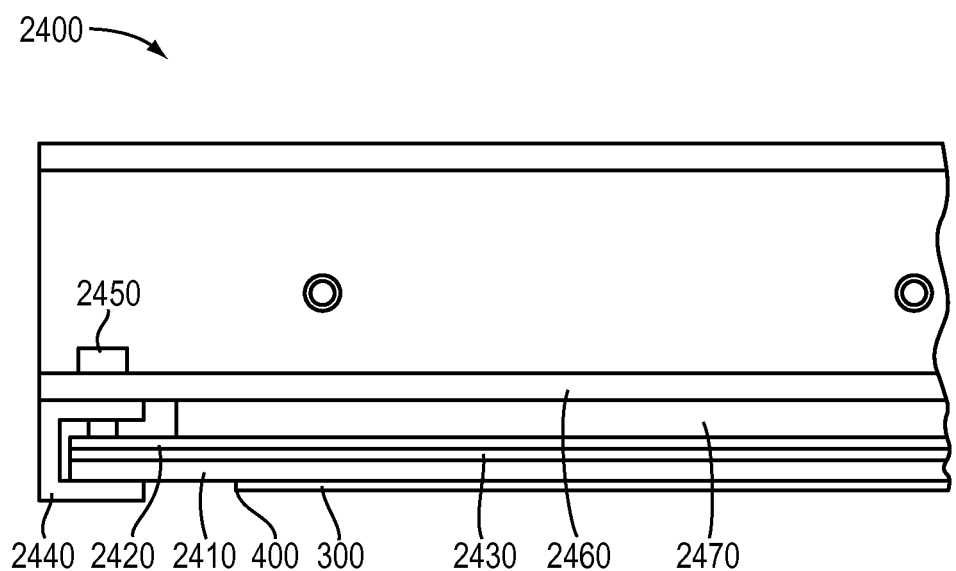
FIG. 25 is a magnified cross-section of portions of the module depicted in FIGS. 24A and 24B.

FIGS. 24A and 24B depict the back and front sides, respectively, of a module 2400 that may be utilized as a retrofit for, e.g., a two-foot-square luminaire. FIG. 25 depicts a magnified cross-section of the module 2400 with many of the components (e.g., phosphors, optics, and drive circuitry) omitted for clarity. Individual substrates 400 may be mounted (e.g., via an adhesive or mechanism such as a clamp) to a single larger substrate 2410, which may include or consist essentially of, e.g., glass and/or plastic. The substrate 2410 may then be attached to a large mechanical support sheet 2420 (that may include or consist essentially of a rigid material such as metal). An optional diffuse reflector 2430 may be disposed between the substrate 2410 and mechanical support sheet 2420. As shown, the above-described components are held in a c-channel-type extrusion 2440 by means of, e.g., screws 2450. The screws 2450 may also affix the small c-channel 2440 to larger c-channel extrusions 2460 running approximately perpendicularly across the back of the mechanical support sheet 2420. In this manner, the entire assembly may be made mechanically rigid to prevent appreciable sag of the substrate 2410. The large c-channel extrusion 2460 also advantageously provides a mechanical mounting point for power supplies and/or drivers 2470 used to deliver the required voltage to the semiconductor dies 300 and drive circuit boards 2480 at the perimeter of the array.

Figure 26:
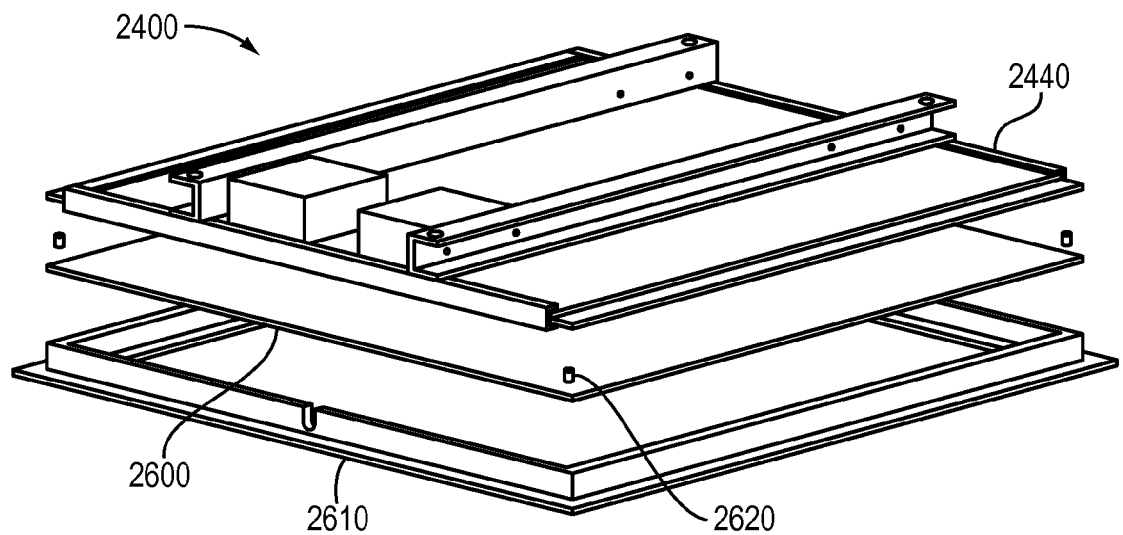
FIGS. 26 and 27 are, respectively, a partially exploded isometric top view and an unexploded isometric top view of an electronic module utilized as a retrofit for a luminaire in accordance with various embodiments of the invention.
Figure 27:
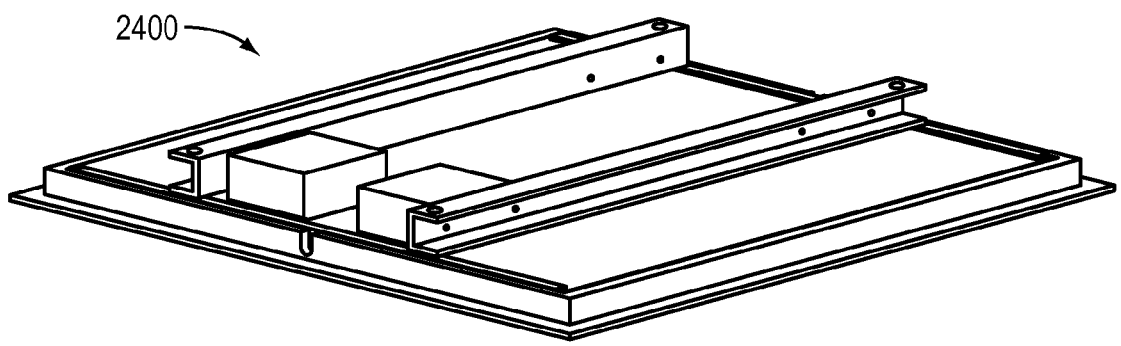
Figure 28A:
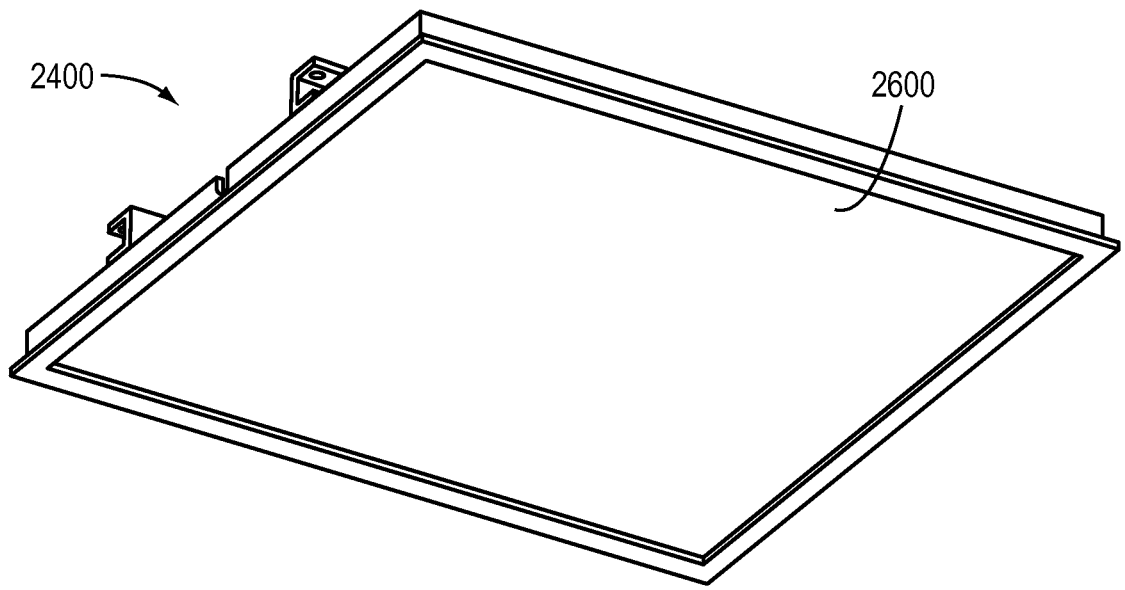
FIG. 28A is a bottom isometric view of the module depicted in FIGS. 26 and 27 incorporating an optional diffuser sheet.
Figure 28B:
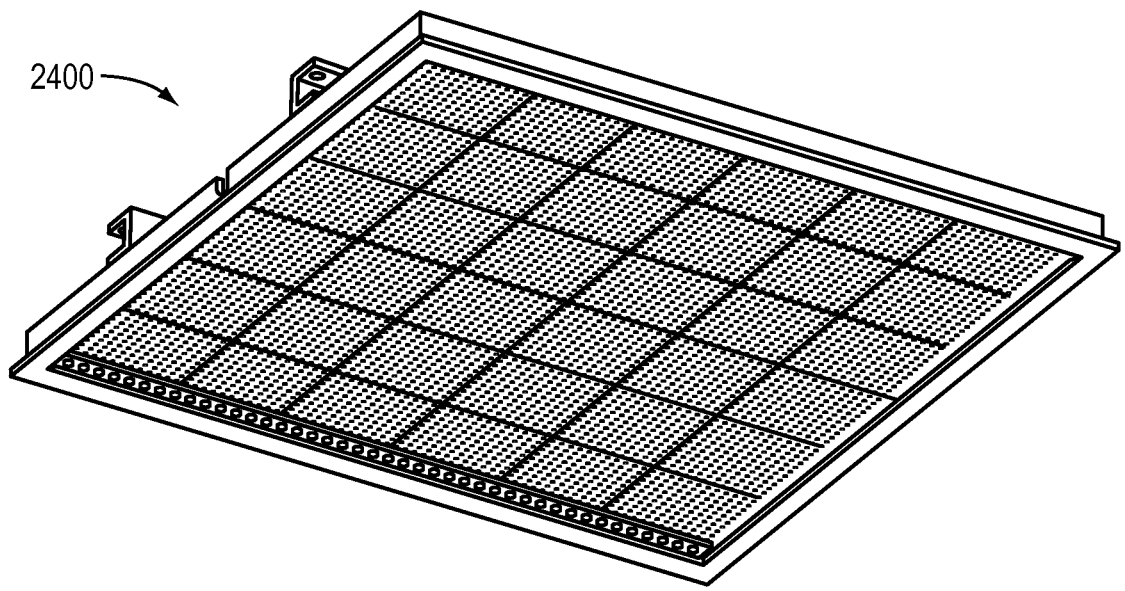
FIG. 28B is a bottom isometric view of the module depicted in FIGS. 26 and 27 without the optional diffuser sheet.

FIG. 26 shows a partially exploded view of a completed module 2400 that incorporates a diffuser sheet 2600 and a steel frame 2610 that holds the lens for a typical two-foot-square fluorescent troffer luminaire. Standoffs 2620 may be used to set the distance between the diffuser sheet 2600 and substrate 2410. As shown, the completed module and diffuser sheet may be easily inserted into the frame 2610 and, once assembled as shown in FIG. 27, may provide a simple and thin drop-in solution as a retrofit kit for fluorescent luminaires. FIGS. 28A and 28B show bottom views of the completed module 2400 in the steel frame with and without the diffuser sheet 2600, respectively.

EXAMPLES

Example 1

Conductive traces 1 mm wide were formed on glass and polyethylene terephthalate (PET) substrates, where the PET substrates had a thickness of about 5 mils. The conductive traces included a bottom layer of Cr and a top layer of Au evaporated sequentially onto the substrate. The Cr thickness was about 30 nm and the Au thickness was about 300 nm. The conductive traces had gaps with a width of about 90 µm in positions where LEDs were to be attached. The LEDs were about 13 mils wide and about 24 mils long and had two contacts on the same side of the die. Kyocera 0604C ACA was dispensed over the gap such that a portion of the end of each conductive trace adjacent to the gap, as well as the gap region, was covered with ACA. The LED die was then placed, contact side down onto the ACA such that at least a portion of the n-contact was over at least a portion of the trace on one side of the gap and at least a portion of the p-contact was over at least a portion of the trace on the other side of the gap. The PET sheet with LEDs was then placed in a heat press on a compliant pad with the LEDs facing up. A piece of glass was placed over the LEDs, and the heat-plate portion of the press was applied. The plate was set to 125° C. Pressure was applied and the PET sheet was left in the press for 10 min, then removed from the press and allowed to cool before removing the glass on the surface. Following the heat press operation, the sheet was dimpled where the LEDs were, indicating a deformation of the PET sheet during the process. The LED die attached to the PET substrates had 100% yield with respect to conduction, with no shorts or opens. LED die attached to the glass slide via an equivalent process exhibited a large percentage (~50% or more) of intermittent contact failures.

Example 2

Conductive traces 1 mm wide were formed on PET substrates having thicknesses of about 5 mils. Conductive traces were formed on the substrates by screen printing of silver ink. The height of the silver screen-printed traces was about 4 µm. The conductive traces had gaps with widths of approximately 90 µm to 150 µm in positions where LEDs were to be attached. The LEDs were about 13 mils wide and about 24 mils long and had both contacts on the same side of the die. Kyocera 0604C ACA was dispensed over the gap, such that a portion of the end of each conductive trace adjacent to the gap, as well as the gap region, was covered with ACA. The LED die was then placed, contact side down, onto the ACA such that at least a portion of the n-contact was over at least a portion of the trace on one side of the gap and at least a portion of the p-contact was over at least a portion of the trace on the other side of the gap. The PET sheet with LEDs was then placed in a heat press on a compliant pad with the LEDs facing up. A piece of glass was placed over the LEDs, and the heat plate portion of the press was applied. The heat plate was set to 125° C. Pressure was applied, and the PET sheet was left in the press for 10 min and then removed from the press and allowed to cool before removing the glass from the surface. As mentioned in Example 1, following the heat press operation, the sheet was dimpled where the LEDs were attached, indicating a deformation of the PET sheet during the process. The LED die attached to the PET substrates had over 99.8% yield with respect to conduction, with only shorts for the 0.2% failed LEDs for placement of over 7000 die.

Example 3

A device featured a LED emitting blue light adhered to a yielding substrate as described above, and a phosphor mixture was disposed in a well surrounding the LED such that the light emitted from the device was substantially white with a specific nominal correlated color temperature (CCT) and a Color Rendering Index (CRI) of at least 75. The phosphor mixture included 6% to 12% by weight yellow-emitting $Al_5O_{12}Y_3:Ce^{2+}$ phosphor (NYAG4563-S), 10% to 50% by weight (relative to the first phosphor) amber-emitting $(SrBaMg)_2SiO_4:Eu^{2+}$ phosphor (O6040), 3% to 30% by weight (relative to the first phosphor) red-emitting $CaAlSiN_3:Eu^{2+}$ phosphor (R6535), and 1% to 5% by weight (relative to the first phosphor) green-emitting $(SrBaMg)_2SiO_4:Eu^{2+}$ phosphor (Y3957), all of which are available from Intematix Corporation of Fremont, Calif.

The phosphor mixture was combined in the ratio of 1% to 5% by weight (relative to the first phosphor) with fumed silica (CAB-O-SIL CT-1221) available from Cabot Corporation of Billerica, Mass. in the ratio of 1% to 2% by weight with optically transparent silicone elastomer (Sylgard 184) available from Dow Corning Corporation. The fumed silica (in other embodiments fumed alumina is utilized in addition to or instead of fumed silica) alleviates phosphor particle agglomeration and enhances the efficiency of light extraction from the phosphors. The phosphor mixture was degassed and then injected into the wells. The mixture was injected utilizing a 3 cc syringe with a tip size of 27 to 32 gauge, and the phosphor mixture is ejected by means of compressed air at 40 psi or a mechanically-activated plunger. A thickness of 250 to 500 µm was obtained by limiting the stroke length of the plunger or the application of compressed air to a predetermined time (e.g., 2 to 7 seconds).

Two different formulations of the phosphor mixture produced different CCT values. The first mixture provided a CCT of 3500 K, and included 10% NYAG4653-S, 25% R6535, 3% fumed silica, and polydimethylsiloxane (PDMS) material having a refractive index of 1.43, and had a thickness of approximately 250 µm. The second mixture provided a CCT of 5000 K, and included 8.5% NYAG4653-S, 5% R6535, 3% fumed silica, and PDMS material having a refractive index of 1.43, and had a thickness of approximately 250 µm. In another embodiment the phosphor binder was Dow OE-6550 with a refractive index of approximately 1.53.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:
1. An electronic device comprising:
   a light-emitting diode (LED) having first and second spaced-apart contacts; and a flexible substrate having first and second conductive traces on a first surface thereof, the first and second conductive traces being separated on the substrate by a gap therebetween, wherein the first and second contacts are adhered to and in electrical contact with, respectively, the first and second conductive traces with an adhesive material without electrically bridging the traces or the contacts.

2. The electronic device of claim 1, wherein the substrate comprises a local flexing or a local deformation for maintaining electrical contact between the contacts and traces during operation of the LED.

3. The electronic device of claim 1, wherein the first and second spaced-apart contacts are disposed on a first surface of the LED, and further comprising a reflective material over at least a portion of the first surface of the LED.

4. The electronic device of claim 1, wherein the first and second spaced-apart contacts are substantially coplanar.

5. The electronic device of claim 1, wherein the first and second spaced-apart contacts are non-coplanar and the first and second contacts are adhered to and in electrical contact with, respectively, the first and second conductive traces notwithstanding the non-coplanarity of the first and second contacts.

6. The electronic device of claim 1, wherein the LED comprises a semiconductor material comprising at least one of GaN, AlN, InN, or an alloy or mixture thereof.

7. The electronic device of claim 1, wherein the adhesive material comprises a heat- and pressure-activated adhesive material.

8. The electronic device of claim 1, wherein the substrate comprises a localized deformation between the first and second traces, whereby a distance between the first contact and the substrate is substantially equal to a distance between the second contact and the substrate.

9. The electronic device of claim 1, wherein the LED extends across the gap between the first and second traces, and further comprising a second LED, proximate the LED, extending across the gap between the first and second traces.

10. The electronic device of claim 1, wherein the substrate is flexible and deformable.

11. The electronic device of claim 1, wherein a reflectivity of the substrate for a wavelength emitted by the LED is greater than 80%.

12. The electronic device of claim 1, wherein a transmittance of the substrate for a wavelength emitted by the LED is greater than 80%.

13. The electronic device of claim 1, wherein the gap between the first and second traces ranges between approximately 25 µm and approximately 1000 µm.

14. The electronic device of claim 1, wherein the first and second conductive traces comprise a conductive ink.

15. The electronic device of claim 1, wherein the first and second conductive traces comprise at least one of silver, gold, aluminum, chromium, copper, or carbon.

16. The electronic device of claim 1, wherein the substrate comprises at least one of polyethylene naphthalate, polyethylene terephthalate, polycarbonate, polyethersulfone, polyester, polyimide, polyethylene, or paper.

17. The electronic device of claim 1, wherein the LED emits white light having a color temperature in the range of 2000K to 7000K.

18. The electronic device of claim 1, wherein the LED is a bare LED die.

19. The electronic device of claim 1, wherein the LED is a bare inorganic LED die.

20. The electronic device of claim 1, further comprising a power supply electrically connected to the LED.

21. The electronic device of claim 1, further comprising third and fourth conductive traces on a second surface of the substrate opposite the first surface, the third and fourth conductive traces being separated on the substrate by a gap therebetween, a second LED having third and fourth spaced-apart contacts;

wherein the third and fourth contacts are adhered to and in electrical contact with, respectively, the third and fourth conductive traces with an adhesive material without electrically bridging the third and fourth traces or the third and fourth contacts.

22. The electronic device of claim 1, further comprising:

a plurality of additional LEDs disposed on the substrate; and a housing (i) in which the substrate is at least partially disposed and (ii) configured to transmit light emitted from the LED and the plurality of additional LEDs.

23. The electronic device of claim 1, wherein there is no heat sink in thermal communication with the LED.

24. The electronic device of claim 1, wherein a junction temperature of the LED does not exceed 100° C. during operation.

25. The electronic device of claim 1, wherein (i) the LED comprises a p-n junction and (ii) a thermal resistance from the p-n junction to ambient through the substrate is at least 500° C./W.

26. The electronic device of claim 1, further comprising:

a plurality of additional LEDs each having first and second spaced-apart contacts, the LED and the additional LEDs being arranged in a two-dimensional array on the substrate, wherein a heat density generated by the two-dimensional array during operation is less than approximately 0.01 W/cm$^2$.

27. The electronic device of claim 1, further comprising, disposed over the LED, a reflective surface for reflecting converted light toward the flexible substrate.

28. The electronic device of claim 1, wherein (i) the LED comprises a quantum well, and (ii) a distance between the quantum well and the first surface of the substrate is less than 100 µm.

29. The electronic device of claim 1, wherein a side length or diameter of each of the first and second contacts is less than 70 µm.

30. The electronic device of claim 1, wherein a total area of the first surface is at least 15 times an area of the first contact.

31. The electronic device of claim 1, wherein the adhesive material is activatable via application of at least one of pressure, heat, or a magnetic field.

32. The electronic device of claim 1, further comprising a transparent film disposed over the LED and at least a portion of the substrate.

33. The electronic device of claim 1, wherein the adhesive material comprises an anisotropic conductive adhesive (ACA) electrically connecting the first contact only to the first trace and the second contact only to the second trace.

34. The electronic device of claim 33, wherein a portion of the ACA is disposed in the gap and substantially isolates the first contact from the second contact.

35. The electronic device of claim 1, wherein the adhesive material comprises a substantially isotropic conductive adhesive electrically connecting the first contact only to the first trace and the second contact only to the second trace.

36. The electronic device of claim 35, further comprising a non-conductive adhesive material disposed in the gap.

37. The electronic device of claim 1, wherein the LED is a packaged LED.

38. The electronic device of claim 37, wherein the LED is a packaged inorganic LED.

39. The electronic device of claim 1, further comprising an optical element arranged to transmit light emitted by the LED.

40. The electronic device of claim 39, wherein the optical element is disposed above and optically coupled to the LED, the LED being disposed between the optical element and the substrate.

41. The electronic device of claim 39, wherein the optical element is disposed in contact with at least one of the substrate or the traces so as to enclose the LED between the substrate and the optical element.

42. The electronic device of claim 39, further comprising:
a plurality of additional LEDs each having first and second spaced-apart contacts, the LED and the additional LEDs being arranged in a two-dimensional array on the substrate; and
a plurality of additional optical elements each disposed over and optically coupled to one of the additional LEDs,
wherein (i) the optical element is optically coupled to the LED, and (ii) each additional optical element is optically coupled to one of the additional LEDs.

43. The electronic device of claim 39, wherein the optical element comprises a diffusive optical element.

44. The electronic device of claim 39, wherein the optical element comprises an optically transparent plate or an optically transparent film.

45. The electronic device of claim 39, wherein the optical element is flexible.

46. The electronic device of claim 1, further comprising, disposed on the substrate, a control circuit electrically connected to the LED.

47. The electronic device of claim 46, wherein the control circuit is configured to control dimming of the LED.

48. The electronic device of claim 46, further comprising:
a plurality of additional LEDs disposed on the substrate; and
a housing (i) in which the substrate is at least partially disposed, (ii) in which the control circuitry is disposed, and (iii) configured to transmit light emitted from the LED and the plurality of additional LEDs.

49. The electronic device of claim 46, wherein the control circuit is configured to control a color temperature of light emitted by the electronic device.

50. The electronic device of claim 1, further comprising, disposed over at least a portion of the LED, a phosphor material for converting at least a portion of light emitted by the LED to light of a different wavelength.

51. The electronic device of claim 50, further comprising an optically transparent material disposed between the LED and the phosphor material.

52. The electronic device of claim 50, further comprising, disposed over the phosphor material, a reflective surface for reflecting converted light toward the flexible substrate.

53. The electronic device of claim 50, further comprising a second substrate disposed over the flexible substrate and the first and second conductive traces, the second substrate comprising an opening defined thereby, the LED and the phosphor material being disposed in the opening.

54. The electronic device of claim 53, further comprising a transparent film disposed over the opening in the second substrate.

55. The electronic device of claim 53, wherein the second substrate is flexible.

* * * * *